United States Patent
Ellä et al.

(10) Patent No.: US 6,670,866 B2
(45) Date of Patent: Dec. 30, 2003

(54) BULK ACOUSTIC WAVE RESONATOR WITH TWO PIEZOELECTRIC LAYERS AS BALUN IN FILTERS AND DUPLEXERS

(75) Inventors: Juha Ellä, Halikko (FI); Robert Aigner, München (DE)

(73) Assignee: Nokia Corporation, Espoo (FI)

(*) Notice: Subject to any disclaimer, the term of this patent is extended or adjusted under 35 U.S.C. 154(b) by 3 days.

(21) Appl. No.: 10/045,645

(22) Filed: Jan. 9, 2002

(65) Prior Publication Data

US 2003/0128081 A1 Jul. 10, 2003

(51) Int. Cl.[7] .............. H03H 9/54; H03H 9/70; H03H 9/205; H03H 7/42; H01L 41/00
(52) U.S. Cl. .......... 333/133; 333/25; 333/189; 333/190; 310/366
(58) Field of Search ............... 333/186–192, 333/133, 25; 310/328, 334, 335, 366

(56) References Cited

U.S. PATENT DOCUMENTS

| | | | | |
|---|---|---|---|---|
| 3,321,648 A | * | 5/1967 | Kolm | 310/321 |
| 3,422,371 A | * | 1/1969 | Poirier et al. | 331/107 A |
| 5,185,589 A | * | 2/1993 | Krishnaswamy et al. | 333/133 |
| 5,361,077 A | * | 11/1994 | Weber | 343/846 |
| 5,692,279 A | * | 12/1997 | Mang et al. | 29/25.35 |
| 5,864,261 A | * | 1/1999 | Weber | 333/187 |
| 5,910,756 A | | 6/1999 | Ella | 333/133 |
| 6,437,482 B1 | * | 8/2002 | Shibata | 310/320 |
| 6,441,539 B1 | * | 8/2002 | Kitamura et al. | 310/346 |

OTHER PUBLICATIONS

"High Performance Stacked Crystal Filters for GPS and Wide Bandwidth Applications"; K. M. Lakin et al.; IEEE 2001 Ultrasonics Symposium Paper 3E06, Oct. 9, 2001.

* cited by examiner

Primary Examiner—Barbara Summons
(74) Attorney, Agent, or Firm—Ware, Fressola, Van Der Sluys & Adolphson LLP

(57) ABSTRACT

A bulk acoustic wave device having two resonators in a stacked-up configuration separated by a dielectric layer. The device can be coupled to a lattice filter or a ladder filter to form a passband filter with an unbalanced input port and two balanced output ports. One or more such passband filters can be used, together with another lattice or ladder filter, to form a duplexer having an unbalanced antenna port, two balanced ports for one transceiver part and two balanced ports for another transceiver part.

48 Claims, 20 Drawing Sheets

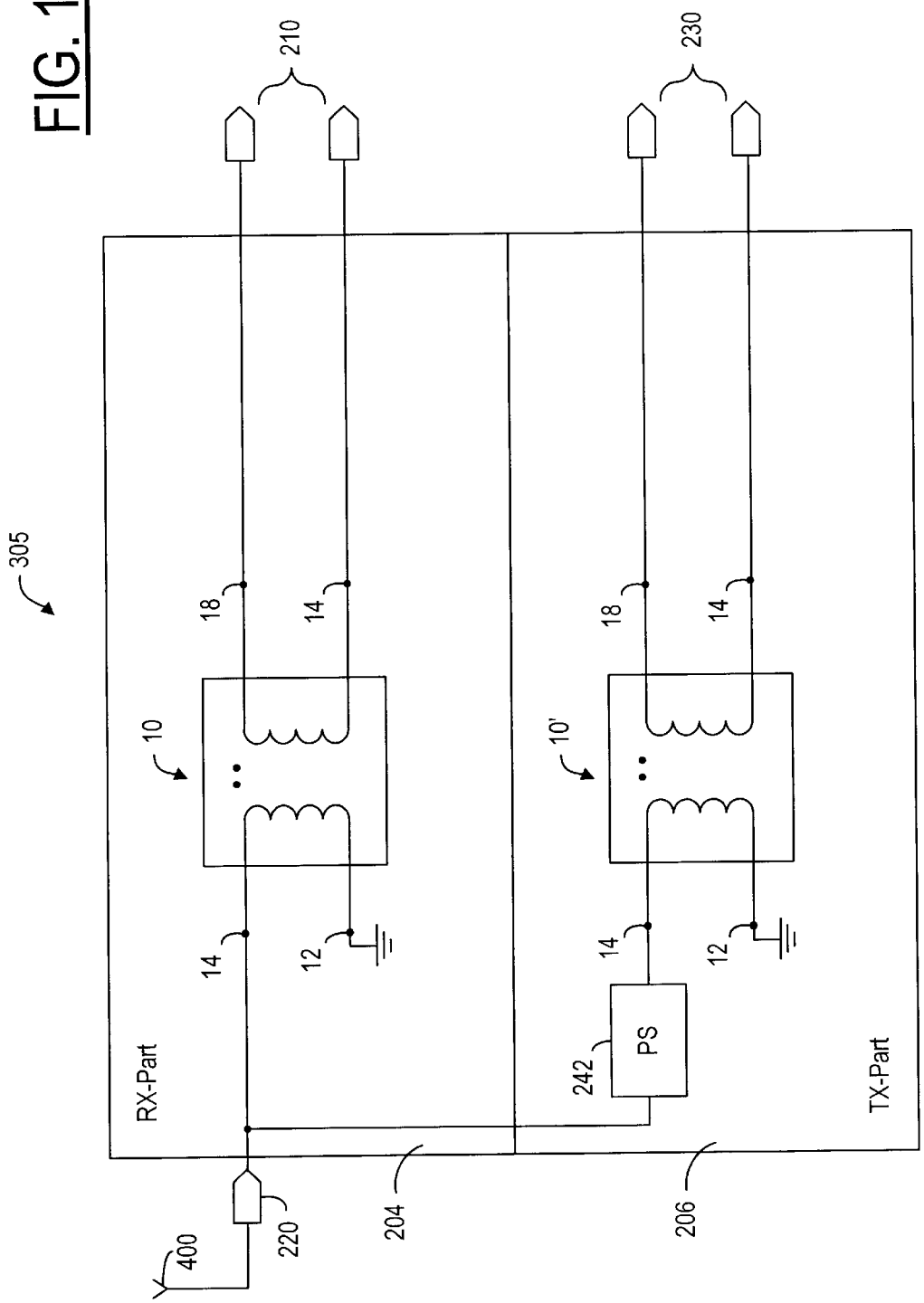

BULK ACOUSTIC WAVE RESONATOR WITH TWO PIEZOELECTRIC LAYERS AS BALUN IN FILTERS AND DUPLEXERS

FIELD OF THE INVENTION

The present invention relates generally to bulk acoustic wave resonators and filters and, more particularly, to bulk acoustic wave baluns used in filters and duplexers.

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical wave is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonance frequency is increased. BAW devices have traditionally been fabricated on sheets of quartz crystals. In general, it is difficult to achieve a device of high resonance frequency using this fabrication method. When fabricating BAW devices by depositing thin-film layers on passive substrate materials, one can extend the resonance frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). An SCF usually has two or more piezoelectric layers and three or more electrodes, with some electrodes being grounded. The difference between these two types of devices lies mainly in their structure. FBARs are usually used in combination to produce passband or stopband filters. The combination of one series FBAR and one parallel, or shunt, FBAR makes up one section of the so-called ladder filter. The description of ladder filters can be found, for example, in Ella (U.S. Pat. No. 6,081,171). As disclosed in Ella, an FBAR-based device may have one or more protective layers commonly referred to as the passivation layers. A typical FBAR-based device is shown in FIGS. 1a to 1d. As shown in FIGS. 1a to 1d, the FBAR device comprises a substrate 501, a bottom electrode 507, a piezoelectric layer 509, and a top electrode 511. The electrodes and the piezoelectric layer form an acoustic resonator. The FBAR device may additionally include a membrane layer 505. As shown in FIG. 1a, an etched hole 503 is made on the substrate 501 to provide an air interface, separating the resonator from the substrate 501. Alternatively, an etched pit 502 is provided on the substrate 501, as shown in FIG. 1b. It is also possible to provide a sacrificial layer 506 separating the resonator and the substrate, as shown in FIG. 1c. It is also possible to form an acoustic mirror 521 between the bottom electrode 507 and the substrate 501 for reflecting the acoustic wave back to the resonator. The substrate can be made from silicon (Si), silicon dioxide (SiO2), Gallium Arsenide (GaAs), glass or ceramic materials. The bottom electrode and top electrode can be made from gold (Au), molybdenum (Mo), tungsten (W), copper (Cu), nickel (Ni), titanium (Ti), Niobium (Nb), silver (Ag), tantalum (Ta), cobalt (Co), aluminum (Al) or a combination of these metals, such as tungsten and aluminum. The piezoelectric layer 130 can be made from zinc oxide (ZnO), zinc sulfide (ZnS), aluminum nitride (AlN), lithium tantalate (LiTaO3) or other members of the so-called lead lanthanum zirconate titanate family. Additionally, a passivation layer typically made from a dielectric material, such as SiO2, Si3N4, or polyimide, is used to serve as an electrical insulator and to protect the piezoelectric layer. It should be noted that the sacrificial layer 506 in a bridge-type BAW device, as shown in FIG. 1c, is, in general, etched away in the final fabrication stages to create an air interface beneath the device. In a mirror-type BAW device, as shown in FIG. 1d, the acoustic mirror 521 consists of several layer pairs of high and low acoustic impedance materials, usually a quarter-wave thick. The bridge-type and the mirror-type BAW devices are known in the art.

It is also known in the art that FBARs can be used to form impedance element filters in a ladder filter configuration that has unbalanced input and output ports, or in a lattice filter configuration that has balanced ports. In some applications it would be advantageous to transform an unbalanced input to a balanced output (or vice versa) within a filter. Such filters have been produced using acoustically coupled surface acoustic wave (SAW) resonators. Basically these structures are based on a pair of resonators, as shown in FIG. 2. As shown, the first resonator 620 generates the acoustic wave and the second resonator 630 acts as a receiver. Since the resonators are not electrically connected, one of them can be connected as an unbalanced device and the other can be used in either as a balanced or an unbalanced device. As shown in FIG. 2, the first resonator 620 provides an unbalanced port 622 for signal input, whereas the second resonator 630 provides two ports 632, 634 for balanced signal outputs. As shown, numerals 610 and 640 denote reflectors or acoustic mirrors for the surface acoustic wave device. This same principle can be used in a BAW device having a structure that has two piezoelectric layers, one on top of each other. Using such a structure, it is possible to perform this unbalanced-to-balanced transformation. This structure can then be used as part of a filter or even a duplexer. One possible way of realizing such a structure is described in "High Performance Stacked Crystal Filters for GPS and Wide Bandwidth Applications", K. M. Lakin, J. Belsick, J. F. McDonald, K. T. McCarron, IEEE 2001 Ultrasonics Symposium Paper 3E-6, Oct. 9, 2001 (hereafter referred to as Lakin). FIG. 3 is a coupled resonator filter (CRF) disclosed in Lakin. As shown in FIG. 3, the CRF is formed by a bottom electrode 507, a bottom piezoelectric layer 508, a cross-over electrode 511, a plurality of coupling layers 512, a ground electrode 513, a top piezoelectric layer 509 and two separate top electrodes 531 and 532. As such, the CRF has a first vertical pair 541 of resonators and a second vertical pair 542 of resonators. Each of the vertical pairs acts as a one-pole filter. In series, the two vertical pairs act as a two-pole filter. The CRF is made on a substrate 501 separated by an acoustic mirror 521. Such a structure requires a considerable amount of substrate area, because the output and input resonators are arranged horizontally side by side. This makes such a filter quite costly.

It is advantageous to provide a method and device capable of transforming unbalanced signals to balance signals wherein the device has a smaller area and a simpler structure.

SUMMARY OF THE INVENTION

According to the first aspect of the present invention, a bulk acoustic wave device has a resonant frequency and an acoustic wavelength characteristic of the resonant frequency. The device comprises:

a first resonator having a first electrode, a second electrode and a first piezoelectric layer disposed between the first and second electrodes;

a second resonator having a third electrode, a fourth electrode and a second piezoelectric layer disposed between the third and fourth electrodes; and an electrically insulating layer, wherein the first resonator and the second resonator are arranged in a stack with the electrically insulating layer disposed between the second electrode and the third electrode.

Preferably, the electrically insulating layer comprises a dielectric layer.

Preferably, the dielectric layer has a thickness substantially equal to one half of the acoustic wavelength.

According to the present invention, the device has a signal input end, a first signal output end, a second signal output end and a device ground, and wherein the first electrode is coupled to the signal input end,
the second electrode is electrically connected to the ground,
the third electrode is coupled to the first signal output end, and
the fourth electrode is coupled to the second signal output end.

Preferably, the device has a capacitive element coupled between the fourth electrode and the device ground for adjusting the parasitic capacitance therebetween. Preferably, the device has an inductance element coupled between the first and second signal output ports, and another inductance element coupled between the signal input port and the device ground for impedance matching and bandwidth widening.

According to the present invention, the first and the second piezoelectric layers each has a thickness substantially equal to one half of the acoustic wavelength.

According to the second aspect of the present invention, a bulk acoustic wave device structure, which is formed on a substrate having an upper section, comprises:

a first electrode provided on the upper section;

a first piezoelectric layer provided on top of at least part of the first electrode;

a second electrode provided on top of at least part of the first piezoelectric layer, wherein the first electrode, the first piezoelectric layer and the second electrode have an overlapping area for forming a first acoustic resonator;

a dielectric layer disposed on top of at least part of the second electrode;

a third electrode disposed on top of at least part of the dielectric layer such that the third electrode and the second electrode are electrically insulated by the dielectric layer, a second piezoelectric layer provided on top of at least part of the third electrode, and a fourth electrode provided on top of at least part of the second piezoelectric layer, wherein the third electrode, the second piezoelectric layer and the fourth electrode have a further overlapping area for forming a second resonator.

Preferably, the bulk acoustic wave device structure also has an acoustic mirror structure provided between part of the first electrode and the upper section of the substrate.

According to the present invention, the acoustic wave device structure has a signal input end, a first signal output end, a second signal output end and a device ground, wherein the first electrode is coupled to the signal input end,
the second electrode is electrically connected to the ground,
the third electrode is coupled to the first signal output end, and
the fourth electrode is coupled to the second signal output end.

According to the present invention, the first acoustic resonator and the second acoustic resonator have a further overlapping area for defining an active area of the bulk acoustic wave device structure. The second electrode has an extended portion located outside the active area, and the fourth electrode has a further extended portion located outside the active area, wherein the extended portion and the further extended portion have yet another overlapping area for forming said capacitive element.

According to the third aspect of the present invention, an acoustic wave apparatus, which is formed on a substrate having an upper surface, has a device ground, a signal input, a first signal output, a second signal output and a device ground. The structure further comprises:

a first bulk acoustic wave device; and
a second bulk acoustic wave device coupled to the first bulk acoustic wave device, wherein
the first bulk acoustic wave device comprising:
    a first resonator having a first electrode, a second electrode and a first piezoelectric layer disposed between the first and second electrodes; and
    a second resonator having a third electrode, a fourth electrode and a second piezoelectric layer disposed between the third and fourth electrodes, wherein the first resonator and the second resonator are arranged in a stack with a first dielectric layer disposed between the second and third electrode for electrically insulating the second electrode from the third electrode, and the second bulk acoustic wave device comprising:
    a first resonator having a first electrode, a second electrode and a first piezoelectric layer disposed between the first and second electrodes; and
    a second resonator having a third electrode, a fourth electrode and a second piezoelectric layer disposed between the third and fourth electrodes, wherein the first resonator and the second resonator are arranged in a stack with a first dielectric layer disposed between the second and third electrode for electrically insulating the second electrode from the third electrode, and wherein the fourth electrode of the first bulk acoustic wave device is coupled to the first signal output of the structure,
        the fourth electrode of the second bulk acoustic wave device is coupled to the second signal output of the structure,
        the first electrode of the first bulk acoustic wave device is coupled to the signal input of the structure and is electrically connected to the second electrode of the second bulk acoustic wave device, and
        the second electrode and the third electrode of the first bulk acoustic wave device are electrically connected to the device ground and the first electrode of the second bulk acoustic wave device.

According to the fourth aspect of the present invention, a bulk acoustic wave filter has a signal input terminal, a first signal output terminal, a second signal output terminal and a device ground. The bulk acoustic wave filter comprises:

a balun having at least two resonators in a stacked-up configuration including
    a first resonator coupled between a signal input end and the device ground, and
    a second resonator coupled between a first signal output end and a second signal output end, wherein
        the first signal output end is coupled to the first signal output,
        the second signal output end is coupled to the second signal output terminal; and
at least one acoustic filter segment having
    a series element having a first end and a second end, and
    a shunt element having a first end and a second end, wherein
        the first end of the series element is connected to the signal input end of the balun,
        the second end of the series element is connected to signal input terminal,
        the first end of the shunt element is connected to the second end of the series element, and
        the second end (144) of the shunt element (140) is connected to the device ground (12).

According to the present invention, the first resonator (92) of the balun (10) comprises
    a first electrode (40) connected to the signal input end (14),
    a second electrode (44) connected to the device ground (12), and
    a first piezoelectric layer (42) disposed between the first and second electrodes (40, 44), and
the second resonator (94) of the balun (10) comprises
    a third electrode (60) connected to the first signal output end (16),
    a fourth electrode (64) connected to the second signal output end (18), and
    a second piezoelectric layer (62) disposed between the third and fourth electrodes (60, 64), and wherein
        the balun (10) further comprises a dielectric layer (50) disposed between the second electrode (44) of the first resonator (92) and the third electrode (60) of the second resonator (94).

According to the fifth aspect of the present invention, a bulk acoustic wave filter (100') has a signal input terminal (102), a first signal output terminal (104), a second signal output terminal (106) and a device ground (12). The bulk acoustic wave filter further comprises:
    at least one acoustic filter segment (150) having
        a first terminal (152) coupled to the first signal output terminal (104),
        a second terminal (153) coupled to the second signal output terminal (106),
        a third terminal (155),
        a fourth terminal (156),
        a first series element (160) having a first end (162) connected to the first terminal (152) and a second end (164) connected to the third terminal (155),
        a second series element (170) having a first end (172) connected to the second terminal (153) and a second end (174) connected to the fourth terminal (156),
        a first shunt element (180) having a first end (182) connected to the third terminal (155) and a second end (184) connected to the second terminal (153), and
        a second shunt element (190) having a first end (192) connected to the first terminal (152) and a second end (194) connected to the fourth terminal (156); and a balun (10) having at least two resonators in a stacked-up configuration including
    a first resonator (92) coupled between a signal input end (14) and the device ground (12), and
    a second resonator (94) coupled between a first signal output end (16) and a second signal output end (18), wherein
        the signal input end (14) is coupled to the signal input terminal (102),
        the first signal output end (16) is connected to the fourth terminal (156) of the acoustic filter segment (150), and
        the second signal output end (18) is connected to the third terminal (155) of the acoustic filter segment (150).

Preferably, each of the first and second series elements in the bulk acoustic wave filter has a first active area and each of the first and second shunt elements has a second active area greater than the first active area in size.

According to the sixth aspect of the present invention, a duplexer comprises
    a first port (210);
    a second port (220);
    a third port (230);
    a device ground (12);
    a lattice bulk acoustic wave filter (150), disposed between the first port (210) and the second port (220), said lattice bulk acoustic wave filter (150) having
        a first end (151), and
        a second end (154) coupled to the first port (210);
    a balun (10) coupled between the second port (220) and the second end (154) of the lattice filter (150);
    a further bulk acoustic wave filter (150', 250) having
        a first end (151, 251) coupled to the third port (230), and
        a second end (154, 254) coupled to the second port (220); and
    a phase shifting means (242, 244) coupled between the lattice bulk acoustic wave filter (150) and the further bulk acoustic wave filter (150', 250) for matching the lattice bulk acoustic wave filter (150) and the further bulk acoustic wave filter (150', 250), wherein the balun (10) having at least two resonators in a stacked-up configuration including
        a first resonator (92) coupled between a signal input end (14) and the device ground (12), and
        a second resonator (94) coupled between a first signal output end (16) and a second signal output end (18), wherein
            the signal input end (14) is connected to the second port (220), and
            the first and second signal output ends (16, 18) are connected to the second end (154) of the lattice bulk acoustic wave filter (150).

According to the present invention, the further bulk acoustic wave filter can be a further lattice bulk acoustic wave filter. In that case, the duplexer may comprise a further balun (10') coupled between the phase shifting means (242) and the further lattice bulk acoustic wave filter (150'), wherein said further balun (10') having at least two resonators in a stacked-up configuration including
    a first resonator (92) coupled between a signal input end (14) and the device ground (12), and
    a second resonator (94) coupled between a first signal output end (16) and a second signal output end (18), wherein the signal input end is connected to the phase shifting means (242) and the signal output ends (16, 18) are connected to the second end (154) of the further lattice filter (150').

According to the present invention, the further bulk acoustic wave filter can be a ladder bulk acoustic wave filter (250). In that case, the duplexer may comprise a further balun (10') disposed between the ladder bulk acoustic wave filter (250) and the third port (230), wherein said further balun (10') having at least two resonators in a stacked-up configuration including
    a first resonator (92) coupled between a signal input end (14) and the device ground (12), and
    a second resonator (94) coupled between a first signal end (16) and a second signal end (18), wherein the signal input end (14) is connected to the first end (252) of the lattice bulk acoustic device (250), and the signal output ends (16, 18) are connected to the third port (230).

According to the seventh aspect of the present invention, a duplexer comprises
an antenna port (220);
a first transceiver port (210);
a second transceiver port (230);
a device ground (12);
a balun (10) coupled between the antenna port (220) and the first transceiver port (210);
a bulk acoustic wave filter (150', 250) having
    a first end (151, 251) coupled to the second transceiver port (230), and
    a second end (154, 254) coupled to the antenna port (220); and
a phase shifting means (242, 244) coupled between the balun (10) and bulk acoustic wave filter (150', 250) for matching the balun (10) and the bulk acoustic wave filter (150', 250), wherein the balun (10) having at least two resonators in a stacked-up configuration including
    a first resonator (92) coupled between a signal input end (14) and the device ground (12), and
    a second resonator (94) coupled between a first signal output end (16) and a second signal output end (18), wherein
        the signal input end (14) is connected to the antenna port (220), and
        the first and second signal output ends (16, 18) are connected to first transceiver port (210).

According to the present invention, the bulk acoustic wave filter can be one or more lattice and ladder filter segments.

According to the eighth aspect of the present invention, a duplexer comprises
an antenna port (220);
a first transceiver port (210);
a second transceiver port (230);
a device ground (12);
a first balun (10) coupled between the antenna port (220) and the first transceiver port (210);
a second balun (10') coupled between the antenna port (220) and the second transceiver port (230); and
a phase shifting means (242, 244) coupled between the first and second baluns adjacent to the antenna port (220), wherein
    the first balun (10) having at least two resonators in a stacked-up configuration including
        a first resonator (92) coupled between a signal input end (14) and the device ground (12), and
        a second resonator (94) coupled between a first signal output end (16) and a second signal output end (18), wherein
        the signal input end (14) is connected to the antenna port (220), and
        the first and second signal output ends (16, 18) are connected to the first transceiver port (210); and
wherein
    the second balun (10') having at least two resonators in a stacked-up configuration including
        a first resonator (92) coupled between a signal input end (14) and the device ground (12), and
        a second resonator (94) coupled between a first signal output end (16) and a second signal output end (18), wherein
        the signal input end (14) is connected to the antenna port (220) via the phase shifting means (242), and
        the first and second signal output ends (16, 18) are connected to the second transceiver port (230).

The present invention will become apparent upon reading the description taken in conjunction with FIGS. 4 to 18.

BRIEF DESCRIPTION OF THE DRAWINGS

FIG. 18 is a block diagram showing a duplexer, wherein each of the transceiver parts has a balun as its filter.

BEST MODE TO CARRY OUT THE PRESENT INVENTION

Figure 1A:
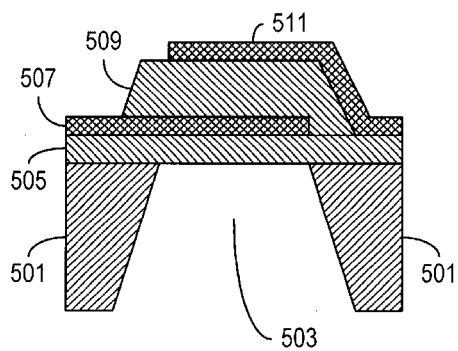
FIG. 1a is a cross-sectional view illustrating a typical bulk acoustic wave device having a resonator and a membrane formed on a substrate, wherein the substrate has a through hole for providing an air interface for the membrane.
Figure 1B:
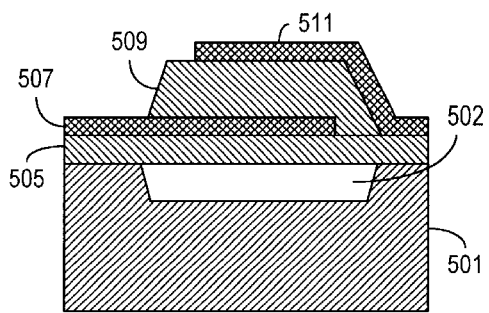
FIG. 1b is a cross-sectional view illustrating a typical bulk acoustic wave device having a resonator and a membrane formed on a substrate, wherein the substrate has an etched section for providing an air interface for the membrane.
Figure 1C:
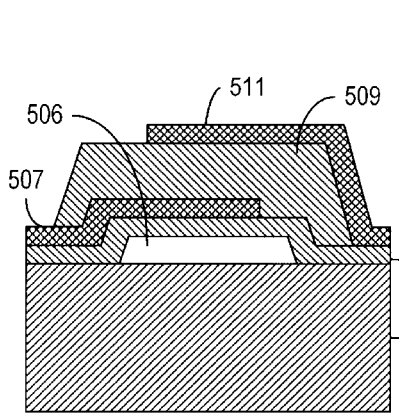
FIG. 1c is a cross-sectional view illustrating a typical bulk acoustic wave device having a resonator and a membrane formed on a substrate, wherein a sacrificial layer is formed between the membrane and the substrate.
Figure 1D:
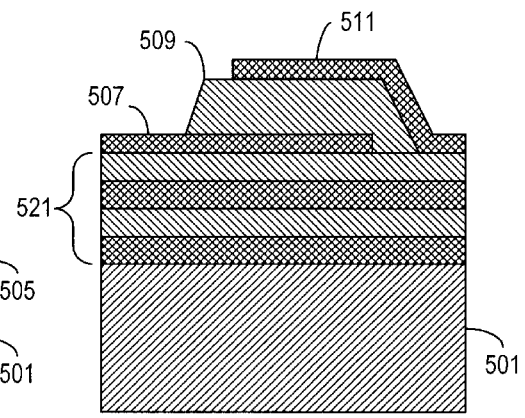
FIG. 1d is a cross-sectional view illustrating a typical bulk acoustic wave device having a resonator formed on a substrate, wherein an acoustic mirror is formed between the substrate and the bottom electrode of the resonator.
Figure 2:
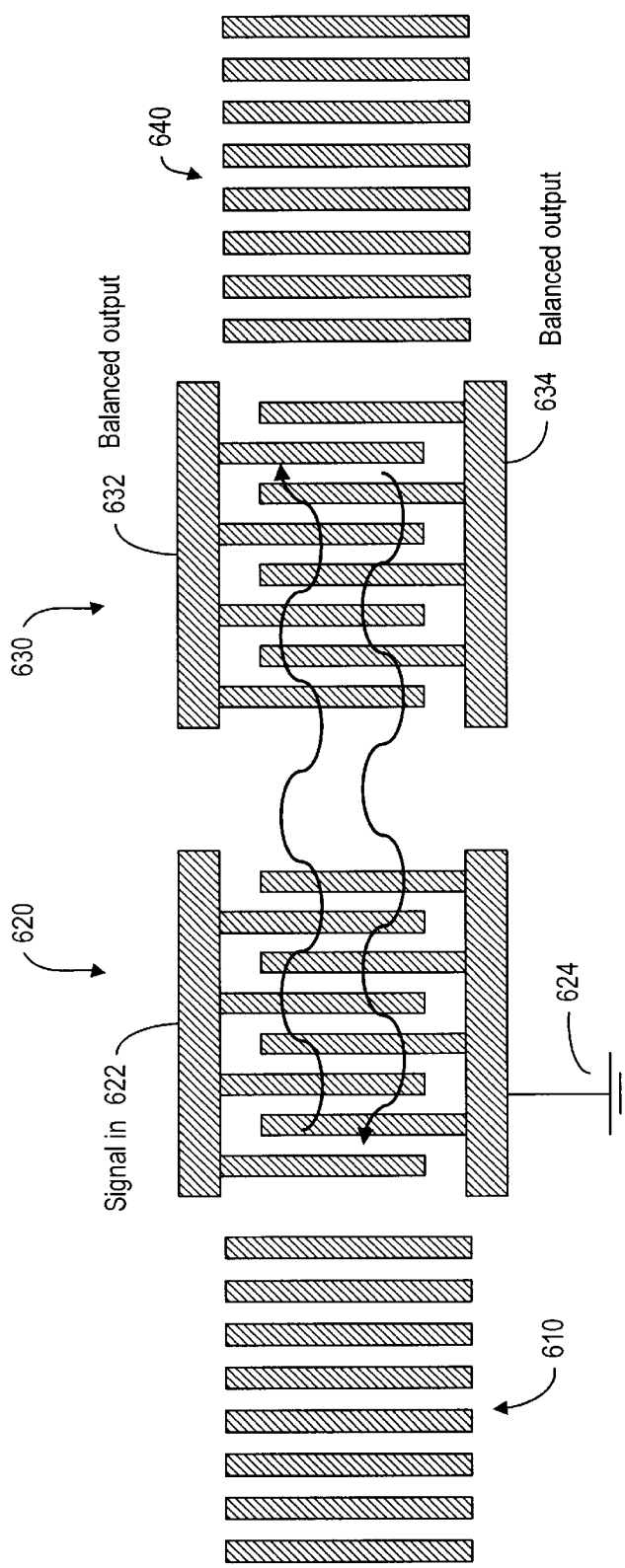
FIG. 2 is a diagrammatic representation showing a prior art arrangement, wherein two resonators are used to transform unbalanced signals to balanced signals.
Figure 3:
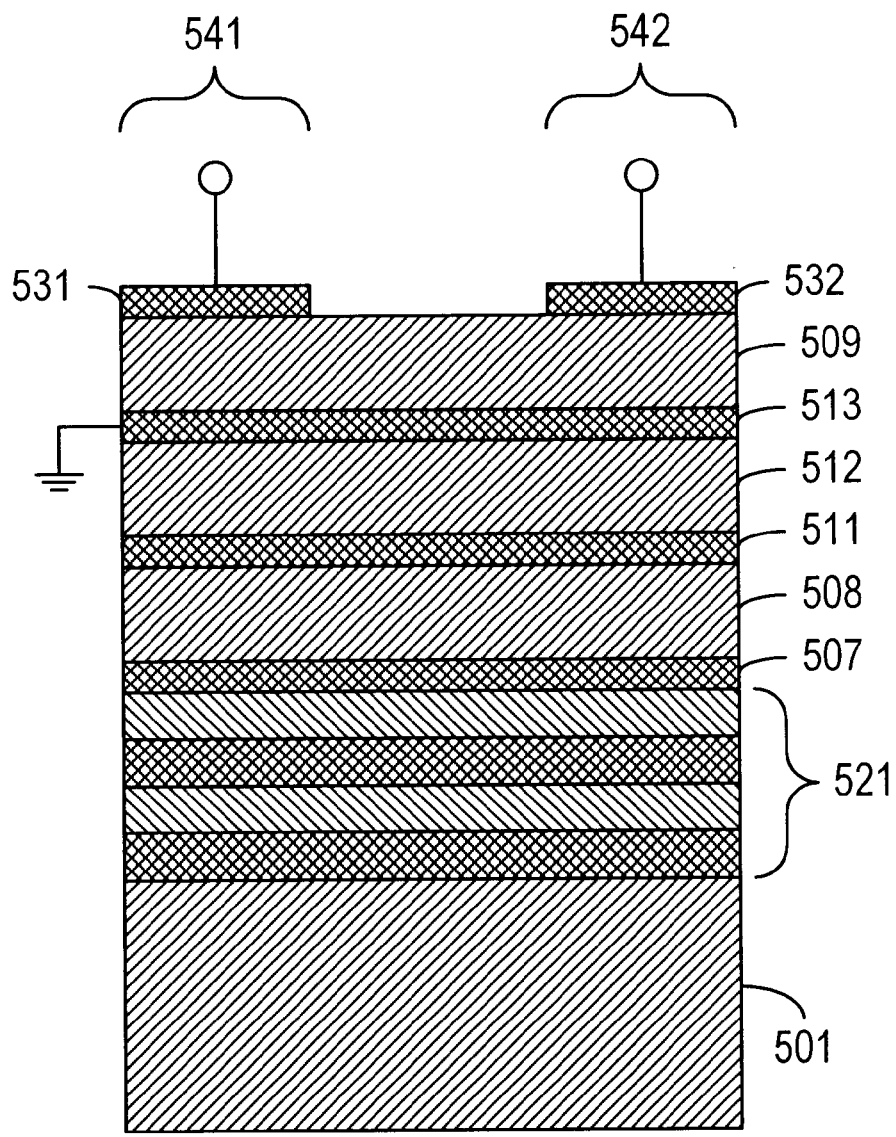
FIG. 3 is a cross sectional view illustrating a prior art arrangement of a coupled resonator filter, wherein two crystal filter resonators are horizontally spaced.
Figure 4:
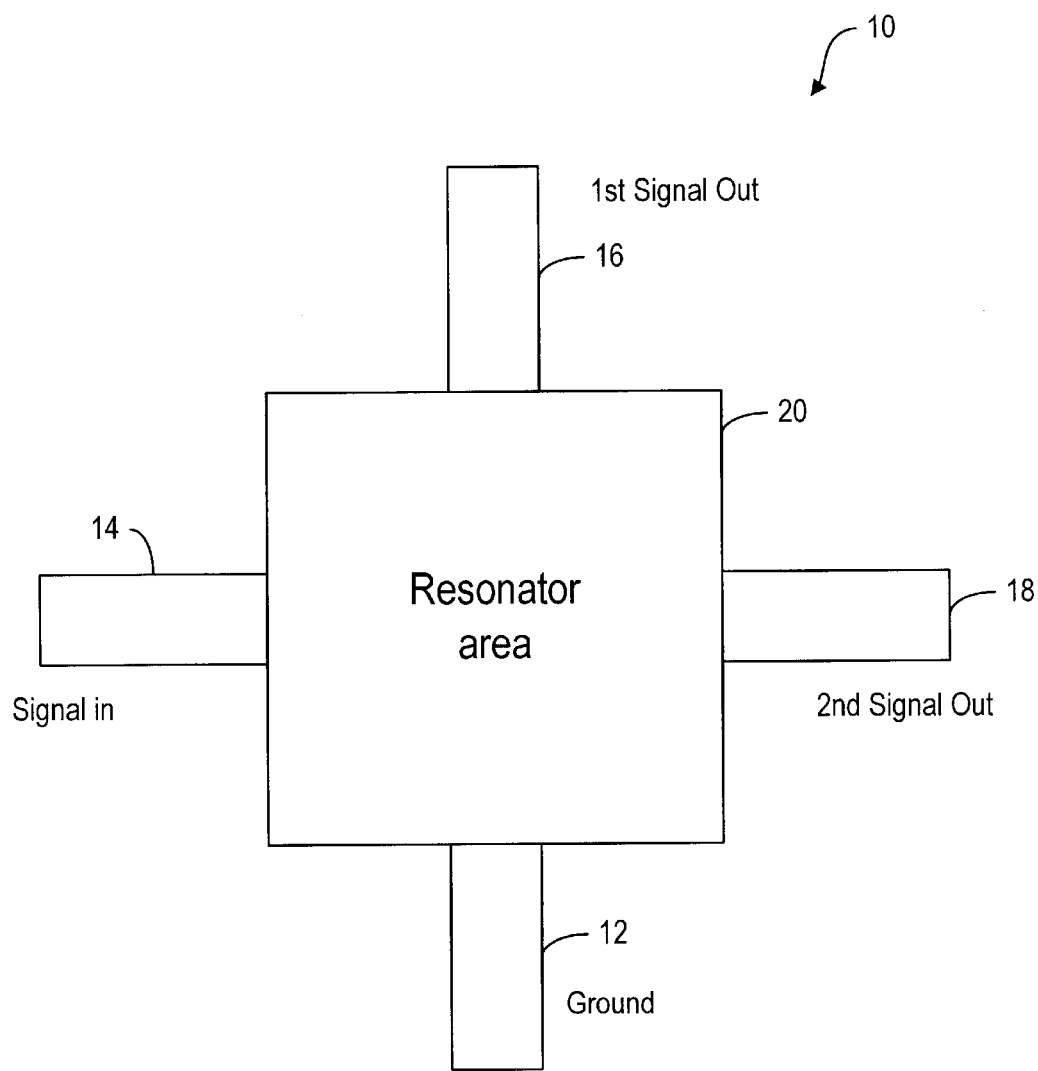
FIG. 4 is a diagrammatic representation showing the top view of a balun with one signal input port and two signal output ports, according to the present invention.
Figure 5:
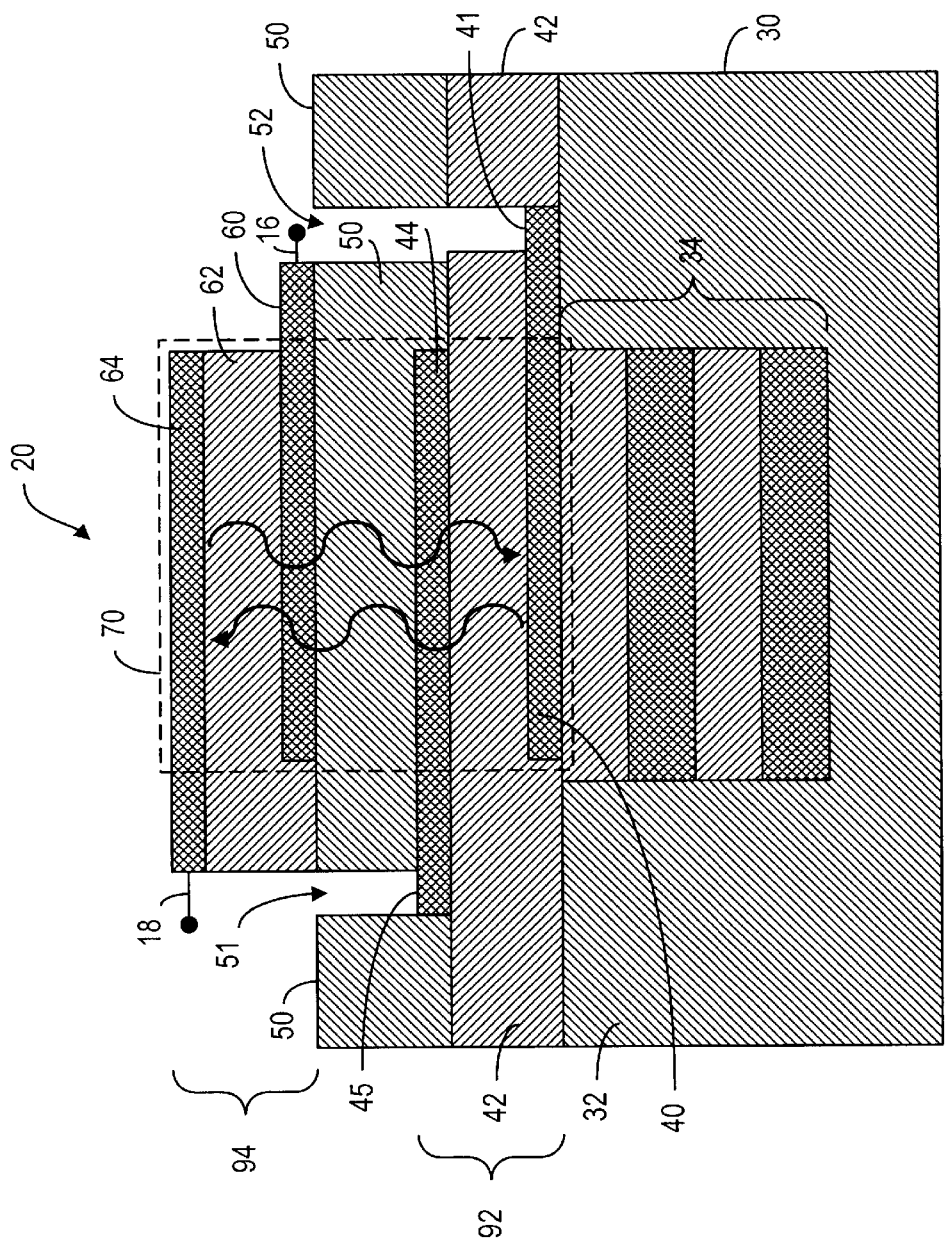
FIG. 5 is a cross-sectional view showing the balun of FIG. 4.

FIG. 4 is a diagrammatic representation of the balun 10, according to the present invention. The balun 10 comprises a bulk acoustic wave device 20 coupled to a device ground 12, a signal input end 14 and two signal output ends 16, 18. The single input end 14 is an unbalanced port, whereas the two signal output ends 16, 18 are balanced ports. The bulk acoustic wave device 20, as shown in FIG. 5, has two resonators and a dielectric layer therebetween. As shown, the device 20 is formed on a substrate 30 and comprises a first electrode 40, a first piezoelectric layer 42, a second electrode 44 connected to the device ground 12, a third electrode 60, a dielectric layer 50 between the second electrode 44 and the third electrode 60, a second piezoelectric layer 62 and a fourth electrode 64. The first electrode 40, the first piezoelectric layer 42 and the second electrode 44 have an overlapping area for forming a first resonator 92. The third electrode 60, the second piezoelectric layer 62 and the fourth electrode 64 have an overlapping area for forming a second resonator 94. The bulk acoustic wave device 20 has a resonant frequency and an acoustic wavelength, $\lambda$, characteristic of the resonant frequency. The thickness of the first and second piezoelectric layers 42, 46 is substantially equal to $\lambda/2$. It is preferable to have an acoustic mirror 34 formed between the first electrode 40 and the substrate 30 to reflect acoustic waves back to the first resonator 92. As shown in FIG. 5, an opening 52 is provided in the first piezoelectric layer 42 and the dielectric layer 50 so that a section of the first electrode 40 is exposed for use as a connection point 41 to the signal input end 14 of the balun 10. Similarly, an opening 51 is provided in the dielectric layer 50 so that a section of the second electrode 44 is exposed for use as a connection point 45 to the device ground 12. The first resonator 92 and the second resonator 94 have an overlapping area 70, defining an active area of the bulk acoustic wave device 20.

Figure 6:
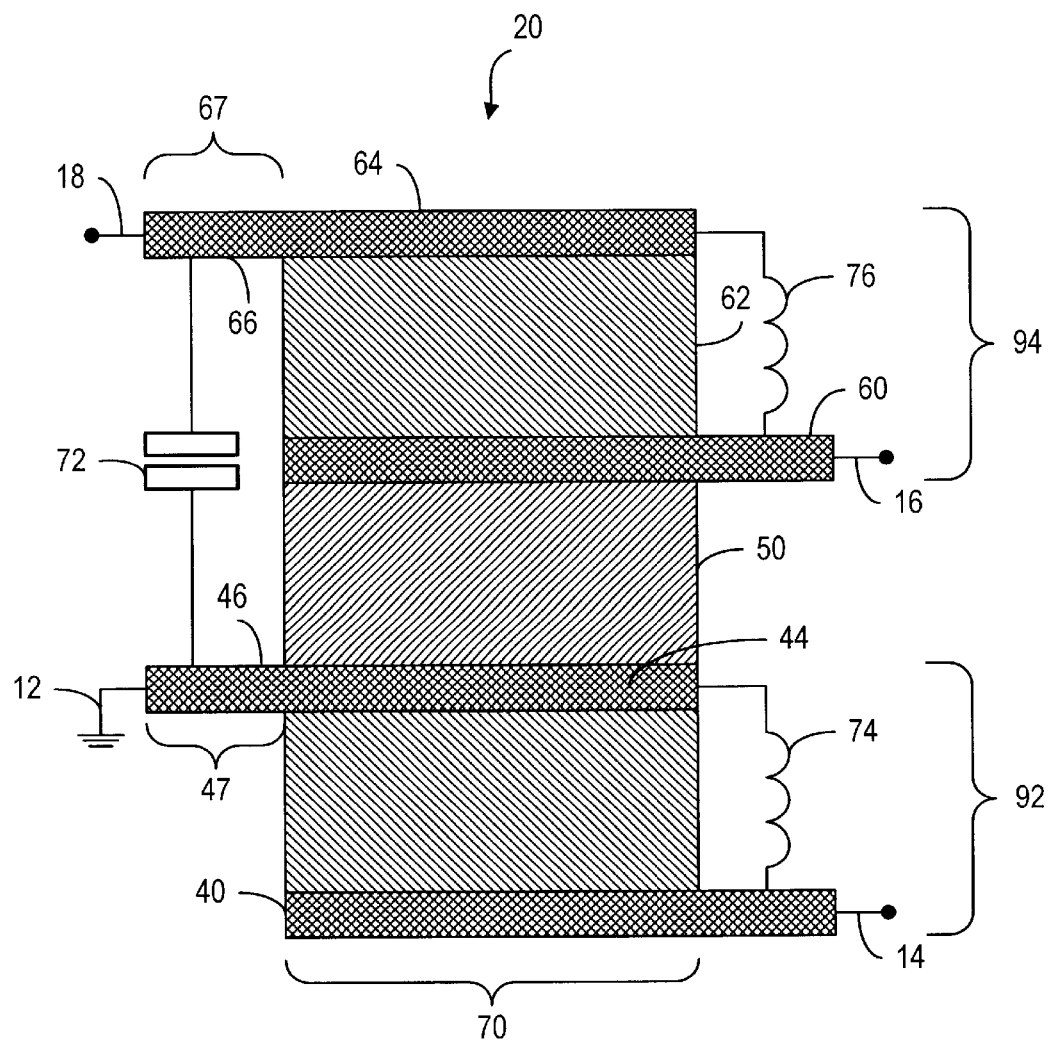
FIG. 6 is a diagrammatic representation showing the bulk acoustic wave device, according to the present invention, with compensation capacitance and bandwidth widening inductance coils.

As can be seen from the cross-sectional view of the two-piezoelectric layer structure of FIG. 5, there will probably be unequal parasitics from the first signal output end 16 and the second signal output end 18 to the ground electrode 44. These unequal parasitics may cause amplitude and phase imbalance between the balanced ports. The unequal parasitics can be improved by using a compensation capacitor 72 between the fourth electrode 64 and the ground electrode 44, as shown in FIG. 6. It should be noted that the first electrode 40 is used as a signal input port so that the ground electrode 44 provides electrical isolation between the input and output. Furthermore, the dielectric layer 50 is used to electrically decouple the lower output port, which is the third electrode 60. The dielectric layer 50 can be any thickness. A thicker dielectric layer reduces the parasitic coupling between the ground electrode 44 and the upper electrodes 60, 64, but it also increases acoustic losses. Thus, a good starting value of the dielectric layer thickness for optimizing performance is $\lambda/2$. Preferably, the dielectric layer 50 has a low dielectric constant to minimize the acoustic losses. The thickness and material of the dielectric layer can also be optimized in a way that the temperature coefficient of the whole device is substantially reduced. Silicon Oxide is known to have such a compensating effect when using the right thickness. Thus, it is advantageous to use a material with a positive temperature coefficient, such as silicon oxide, with a proper thickness as the dielectric layer 50 to compensate the negative overall temperature coefficients of the other layers. In order to widen the bandwidth in this dual-cavity resonator 20, it is possible to couple inductance elements 74, 76 in a shunt of either or both resonators 92, 94. In general, the inductance values for 1 GHz frequencies are small. Thus, it is possible to implement the inductance elements 74, 76 as spiral coils on a chip, for example.

The compensation capacitance is provided so that the capacitance from the first signal output end 16 to ground is equal to that from the second signal output end 18 to ground. One way to provide the compensation capacitance is to clear the second piezoelectric layer 62 outside the active area 70 of the bulk acoustic wave device 20, so that the extended section 46 of the ground electrode 44 and the extended section 66 of the fourth electrode 64 overlap each other over an area 67.

As shown in FIGS. 5 and 6, the unbalanced resonator 92 is at the bottom of the dual-cavity structure. It is also possible that the unbalanced resonator may be at the top of the structure. However, the latter structure would generate unequal parasitics to the substrate from the two balanced ports.

Figure 7:
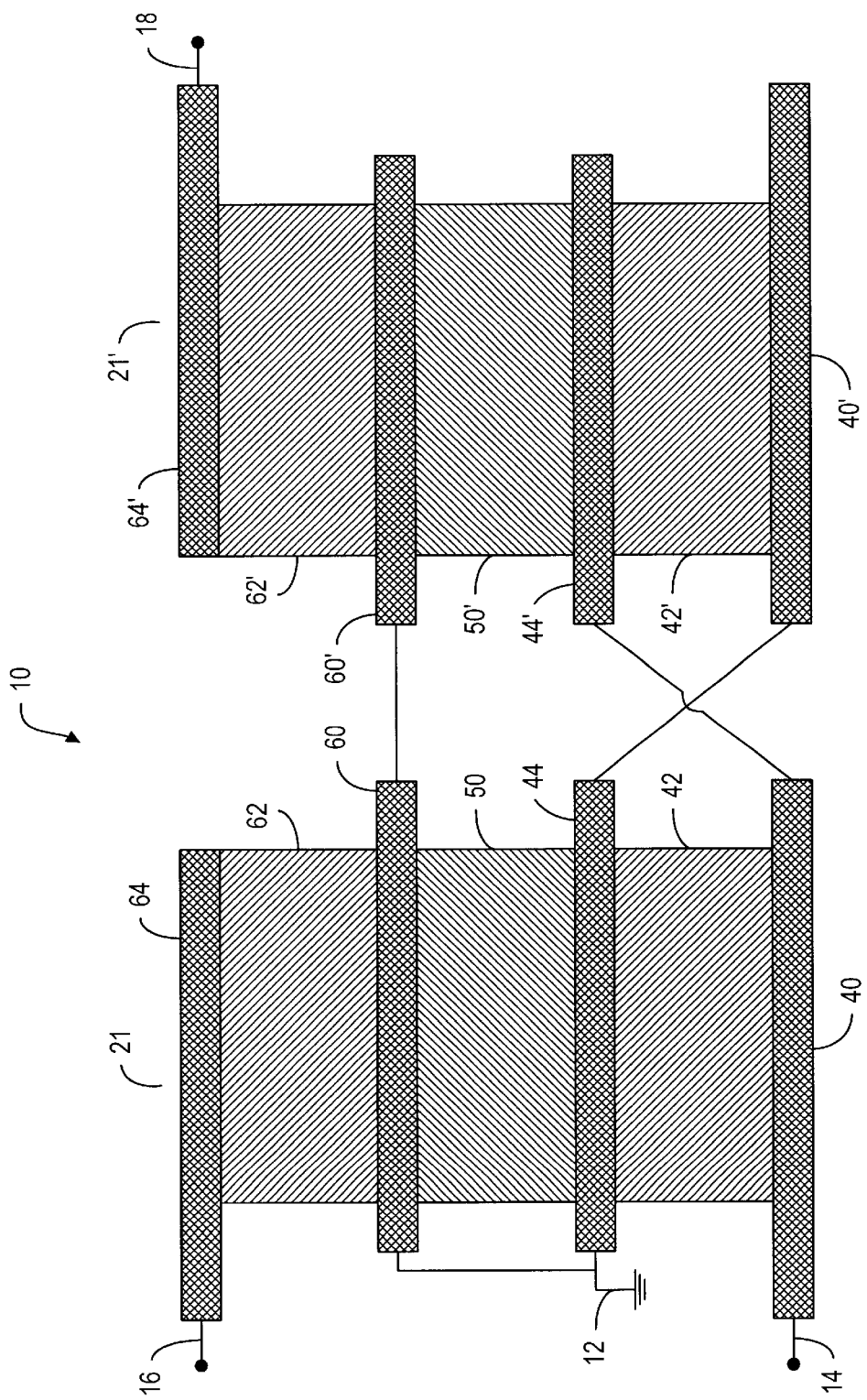
FIG. 7 is a diagrammatic representation showing a bulk acoustic wave device structure with two filter stacks, according to the present invention.

For applications with lower bandwidth requirements, another embodiment of the present invention, as shown in FIG. 7 can be used. As shown in FIG. 7, the balun 10 has two identical stacks 21, 21' of layers, similar to the bulk acoustic wave device 20 of FIGS. 5 and 6. However, the first electrode 40' and the third electrode 60' of the layer stack 21', and the second electrode 44 and the third electrode 60 of the layer stack 20 are connected to ground 12. In addition, the second electrode 44' of the layer stack 21' is connected to the first electrode 40 of the layer stack 21 and is used as the signal input end 14. The top electrode 64 of the layer stack 21 is used as the first signal output end 16, while the top electrode 64' of the layer stack 21' is used as the second signal output end 18. Functionally, this double-structure is equivalent to the balun 10, as shown in FIGS. 4–6. With the double-structure, there is no need for the compensation capacitance because the electrodes 60, 60' below the upper piezoelectric layers 62, 62' are grounded. This electric shielding effect results in the symmetric impedance for the first and second signal output ends 16, 18. The parasitic capacitance of the dielectric layers 50, 50' is parallel to the signal input end 14. This parasitic capacitance somewhat degrades the bandwidth of the device but does not harm its symmetry. The cross-connected input electrodes 40, 44' generate a perfect 180° phase between the acoustic waves in the stack 21 and the stack 21'. Matching and bandwidth widening coils, similar to inductance elements 74, 76, as shown in FIG. 6, can also be implemented on the double-structure 10. The structure, as shown in FIG. 7, also has a potential benefit if the impedance level at the outputs is significantly larger than the impedance at the input. Without further matching elements, the differential impedance at the output is larger than the single-ended input impedance by a factor $\geq 4$.

Figure 8:
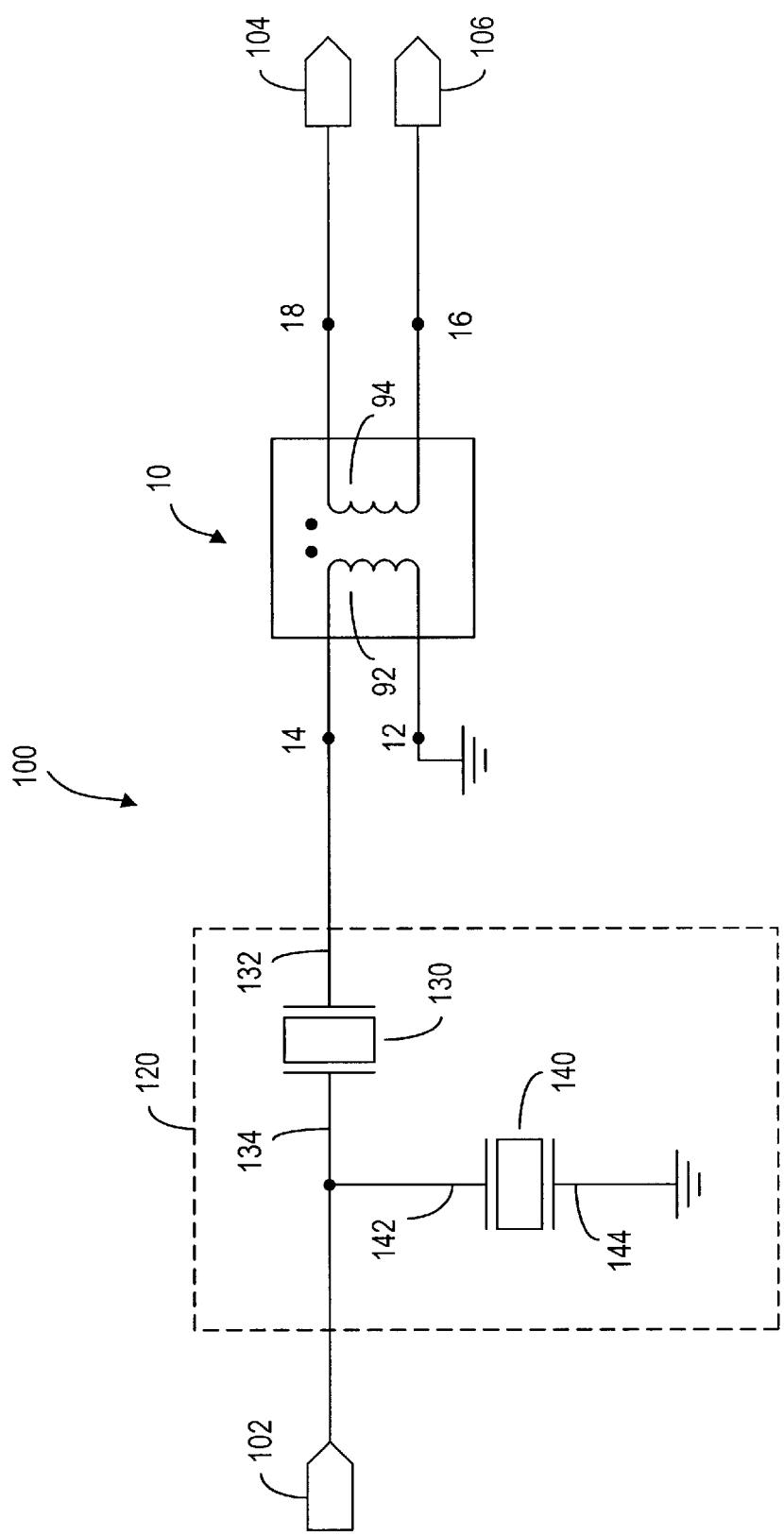
FIG. 8 is a block diagram showing a bulk acoustic wave filtering apparatus with a ladder filter segment, according to the present invention.
Figure 9:
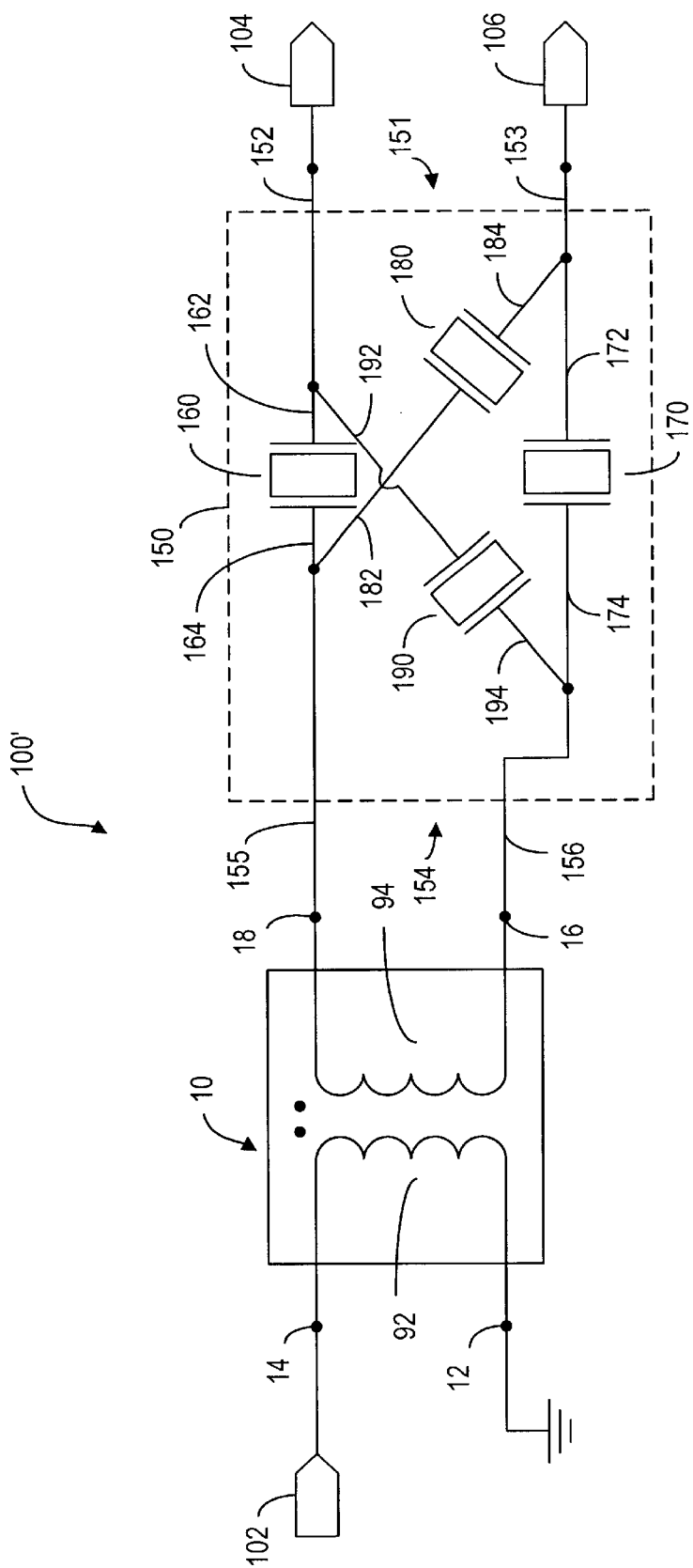
FIG. 9 is a block diagram showing a bulk acoustic wave filtering apparatus with a lattice filter segment, according to the present invention.

The balun 10, as shown in FIGS. 4–7, can be used as part of a filter that has one unbalanced port and two balanced ports. For example, the balun 10 can be coupled to a ladder filter 120 having one or more L-segments to form a passband filter 100, as shown in FIG. 8. The balun 10 can also be coupled to a lattice filter 150 having one or more cross-connection segments to form a passband filter 100', as shown in FIG. 9. The unbalance port is denoted by reference numeral 102, and the balanced ports are denoted by reference numerals 104 and 106. These passband filters 100, 100' can be combined with each other or with other ladder or filter segments to form a duplexer or a dual-channel passband filter, as shown in FIGS. 10–13. In FIGS. 8–13, the balun 10 or 10' is represented by one resonator 92 coupled between a signal input end 14 and a device ground 12, and one resonator 94 coupled between two signal output ends 14, 16. It is understood that either the BAW device of a single structure, as shown in FIGS. 5 and 6, or that of the double structure, as shown in FIG. 7, can be used for the balun 10 or 10' in the filters in FIGS. 8–13.

In the filter 100, as shown in FIG. 8, the balun 10 is combined with the ladder filter 120, which is coupled between the unbalanced port 102 of the passband filter 100 and the signal input end 14 of the balun 10. The two signal output ends 16, 18 of the balun 10 are connected to the balanced ports 104, 106. The ladder filter 120, as shown in FIG. 8, has only one L-segment including one series element 130 and one shunt element 140. However, the ladder filter 120 can have two or more L-segments. As shown in FIG. 8, the series element 130 has a first end 132 connected to the signal input end 14 of the balun 10, and a second end 134 connected to the unbalanced port 102. The shunt element 140 has a first end 142 connected to the second end 134 of the series element 130 and a second end 144 connected to the device ground.

When the balun 10 is combined with the lattice filter 150, the signal input end 14 of the balun 10 is coupled to the unbalanced port 102, and the lattice filter 150 is coupled between the signal outputs 16, 18 of the balun 10 and the balanced ports 104, 106, as shown in FIG. 9. As shown in FIG. 9, the lattice filter 150 has only one cross-connecting segment including two series elements 160, 170 and two shunt elements 180, 190. However, the lattice filter 150 can have two or more such segments. The lattice filter 150 has a first filter end 151 having a first terminal 152 and a second terminal 153, separately coupled to the first and second signal output ends 16, 18 of the balun 10, and a second filter end 154 having a third terminal 155 and a fourth terminal 156 separately coupled to the balanced ports 104, 106 of the passband filter 100'. As shown in FIG. 9, the series element 160 has a first end 162 connected to the first terminal 152 and a second end 164 connected to the third terminal 155. The series element 170 has a first end 172 connected to the second terminal 153 and a second end 174 connected to the fourth terminal 156. The shunt element 180 has a first end 182 connected to the second end 164 of the series element 160, and a second end 184 connected to the first end 172 of the series element 170. The shunt element 190 has a first end 192 connected to the first end 162 of the series element 160, and a second end 194 connected to the second end 174 of the series element 170.

The passband filters 100 and 100', as shown in FIGS. 8 and 9, can be further combined to form a dual-channel passband filter or a duplexer, as shown in FIGS. 10–13. In FIGS. 10–13, each duplexer has two transceiver filters 204 and 206. For example, the filter 100', as shown in FIG. 9 is used as a passband filter in the RX-part 204 of the duplexers 200, 201, 202 and 203, as shown in FIGS. 10–13. Each of these duplexers 200, 201, 202 and 203 has an antenna port 220 and two transceiver ports 210 and 230. The antenna port 210 is unbalanced, whereas each of the two transceiver ports 210, 230 has two balanced terminals.

Figure 10:
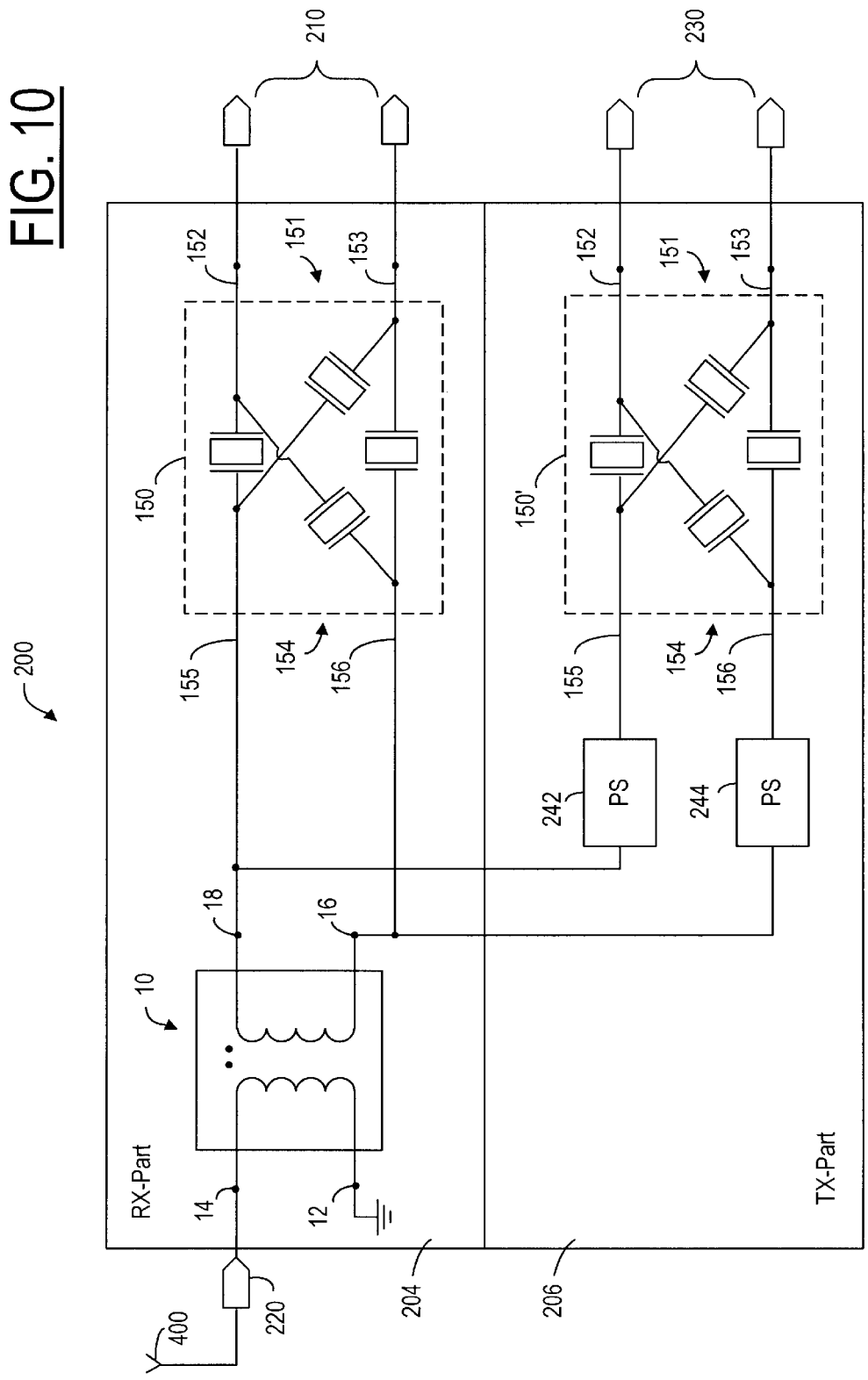
FIG. 10 is a block diagram showing a duplexer with a single balun, according to the present invention, wherein each of the transceiver filters has a lattice filter segment.

In the duplexer 200 as shown in FIG. 10, another lattice filter 150' is used as a passband filter in the TX-part 206. In order to match the lattice filter 150 and the lattice filter 150' two phase shifters 242 and 244 are used to couple between the second end 154 of the lattice filter 150 and the second end 154 of the lattice filter 150'.

Figure 11:
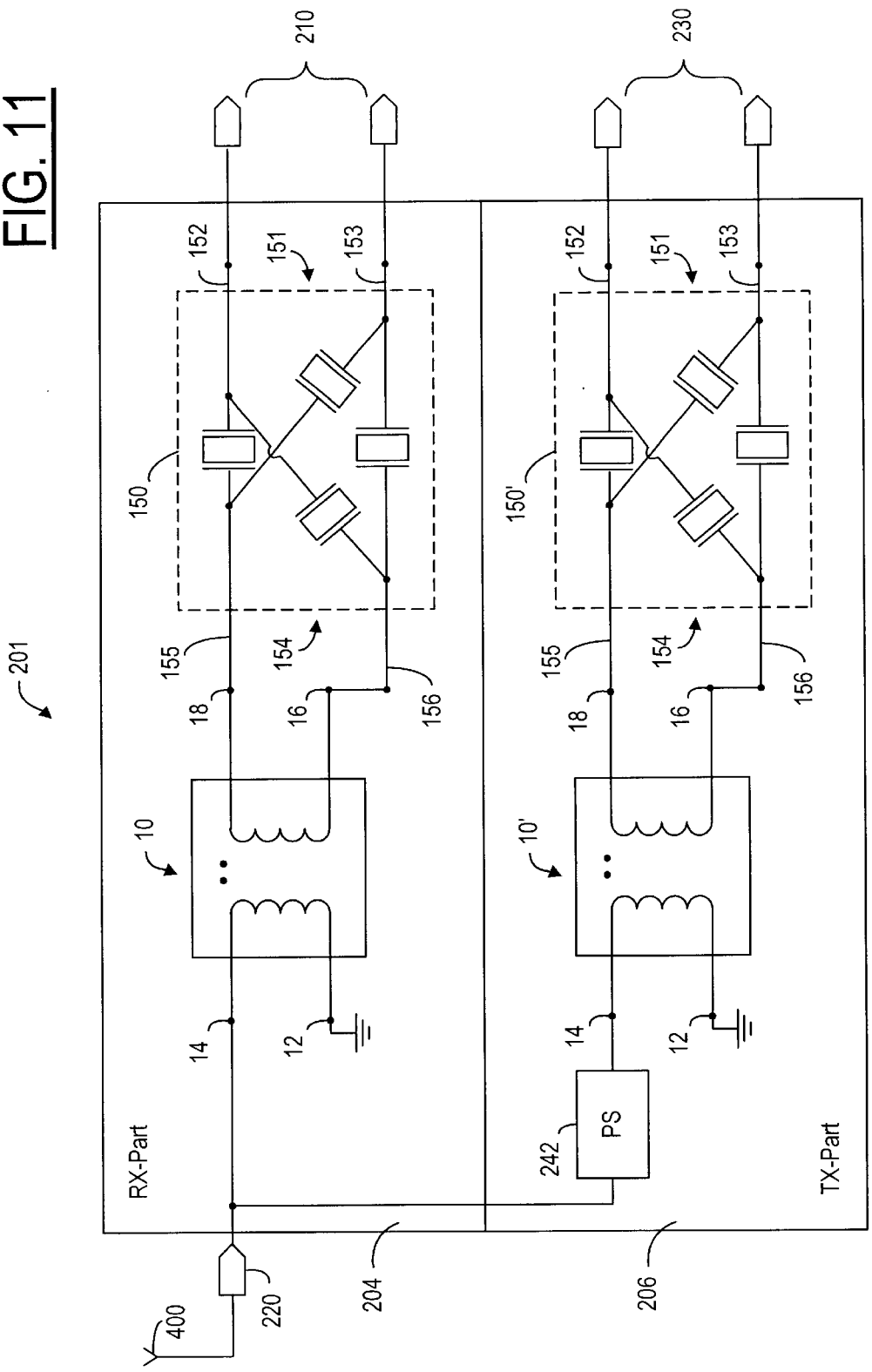
FIG. 11 is a block diagram showing a duplexer wherein each of the transceiver filters has a balun and a lattice filter segment.

In the duplexer 201, as shown in FIG. 11, two similar passband filters are separately used in the RX-part 204 and TX-part 206. A phase shifter 242 is used for matching these two passband filters.

Figure 12:
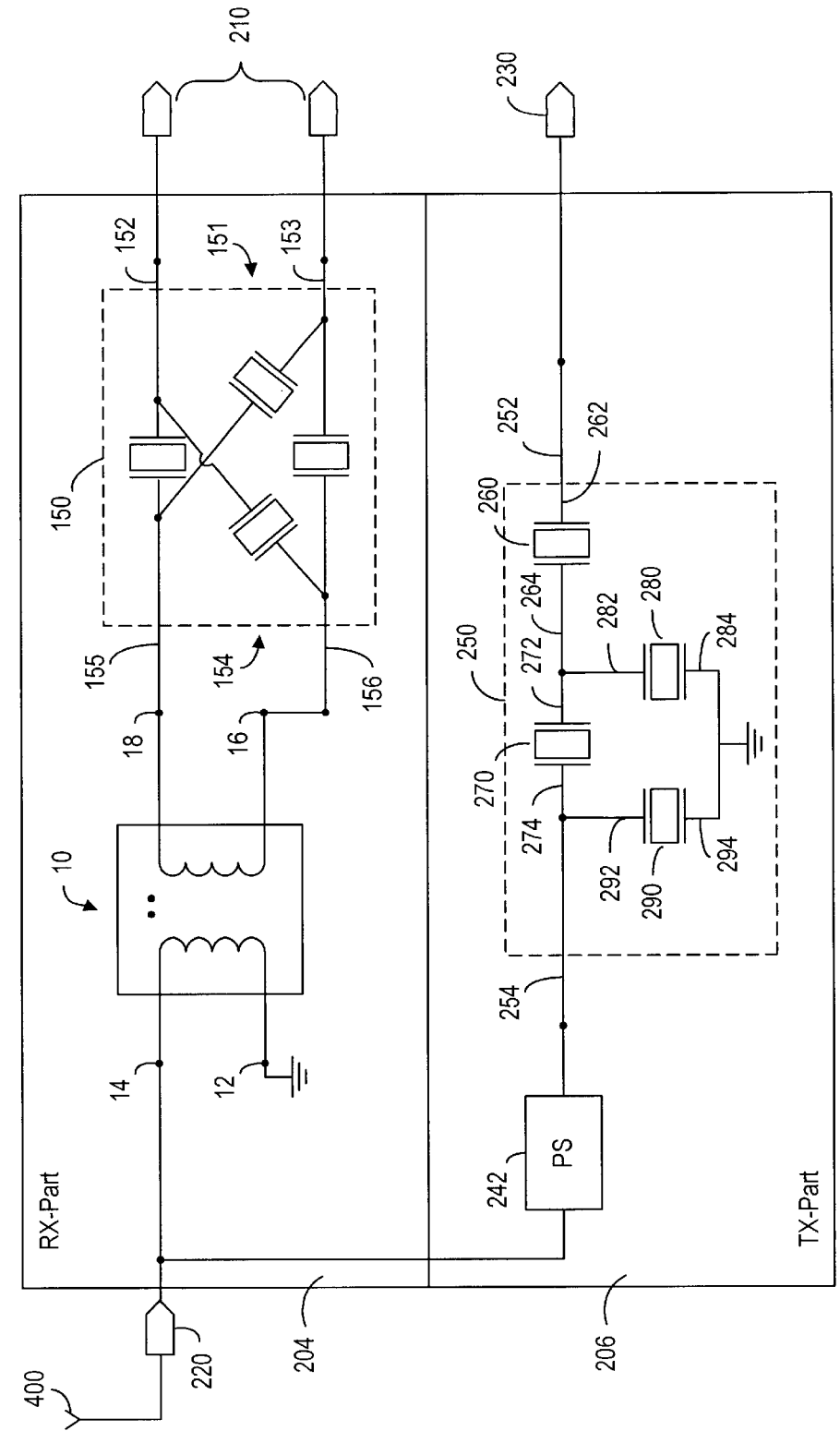
FIG. 12 is a block diagram showing a duplexer, wherein one transceiver filter has a balun coupled to a lattice filter segment, and the other transceiver filter has a ladder filter segment.

In the duplexer 202, as shown in FIG. 12, a ladder filter 250 having two L-segments is used as the passband filter in the TX-part 206. As shown, the ladder filter 250 has a first end 252 connected to an unbalanced port 230, and a second end 254 coupled to the antenna port 220. A phase shifter 242 is used for matching the passband filter in the RX-part 204 and that in the TX-part 206. The ladder filter 250 has two series elements 260, 270 and two shunt elements 280, 290. The series element 260 has a first end 262 connected to the first end 252 of the ladder filter 250, and a second end 264. The series element 270 has a first end 272 connected to the second end 264 of the series element 260, and a second end 274 connected to the second end 254 of the ladder filter 250. The shunt element 280 has a first end 282 connected to the second end 264 of the series element 260, and a second end 284 connected to ground. The shunt element 290 has a first end 292 connected to the second end 274 of the series element 270, and a second end 294 connected to ground.

Figure 13:
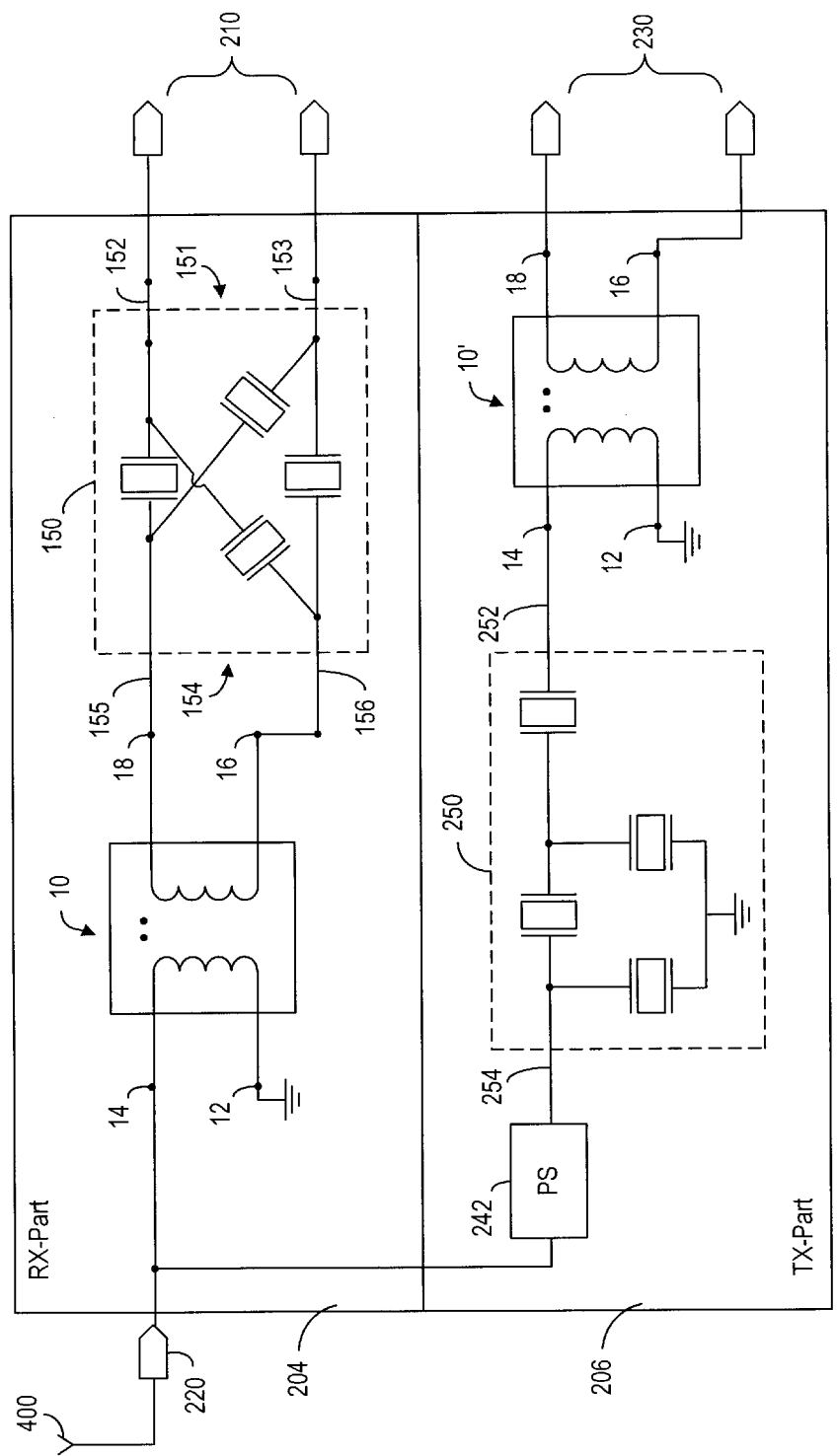
FIG. 13 is a block diagram showing a duplexer, wherein one transceiver filter has a balun coupled to a lattice filter segment, and the other transceiver filter has a balun coupled to a ladder filter.

In additional to the bulk acoustic wave components in the duplexer 202, another balun 10' is used in the duplexer 203, as shown in FIG. 13. In the duplexer 203, the balun 10' is used to transform the unbalanced port of the TX-part into a balanced port. As shown, the signal input end 14 of the balun 10' is connected to the first end 252 of the lattice filter 250, and the signal output ends 16, 18 are connected to the balanced port 230. It should be noted that the lattice filter 250, as shown in FIGS. 12 and 13, has two L-segments. However, the lattice filter can have one L-segment or three or more L-segments.

Figure 14:
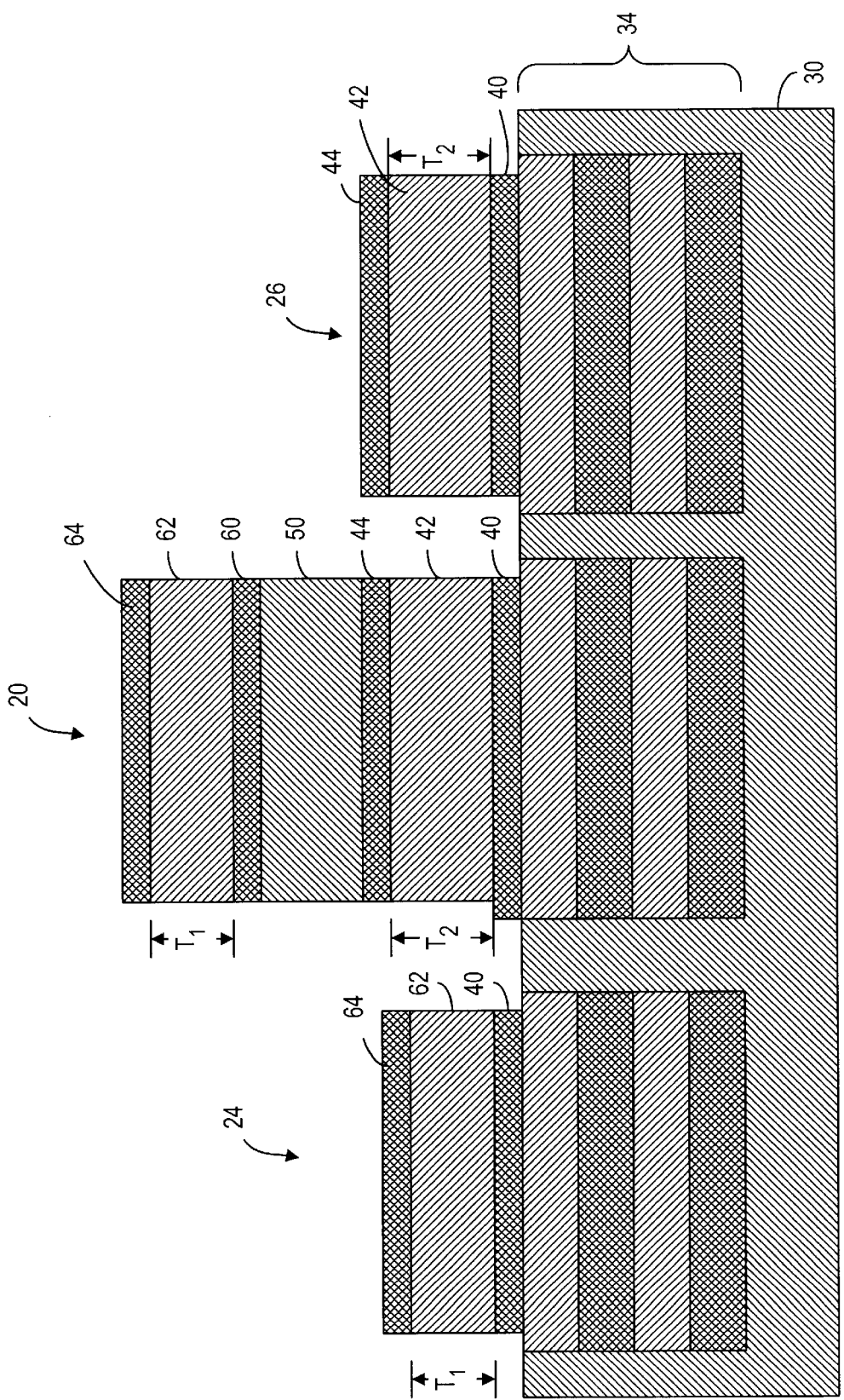
FIG. 14 is a diagrammatic representation showing a duplexer, wherein the piezoelectric layers in the balun have different thicknesses.

In the bulk acoustic wave structure as shown in FIGS. 5 to 7, the piezoelectric layers 42 and 62 have substantially the same thickness, or approximately 8/2. However, when the balun 10 is used in a duplexers 200–203, it is preferred that the thickness $T_1$ the piezoelectric layer 42 of the first resonator 92 is slightly different from the thickness $T_2$ the piezoelectric layer 62 of the second resonator 94. As shown in FIG. 14, $T_2$ is slightly greater than $T_1$. However, it is also possible that $T_2$ is smaller than $T_1$. As such, the piezoelectric layer in each of the shunt and series elements in the TX-part 206 of the duplexer has a thickness substantially equal to $T_2$, whereas the piezoelectric layer in each of the shunt and series elements in the RX-part 204 has a thickness substantially equal to $T_1$. As shown in FIG. 14, the single-layer resonator 24 represents a series or shunt element in the lattice or ladder filter in the RX-part and the single-layer resonator 26 represents a series or shunt element in the lattice or ladder filter in the TX-part of the duplexer. As shown, the piezoelectric layer 62 in the resonator 24 has a thickness substantially equal to $T_1$, whereas the piezoelectric layer 42 in the resonator 26 has a thickness substantially equal to $T_2$.

Figure 15:
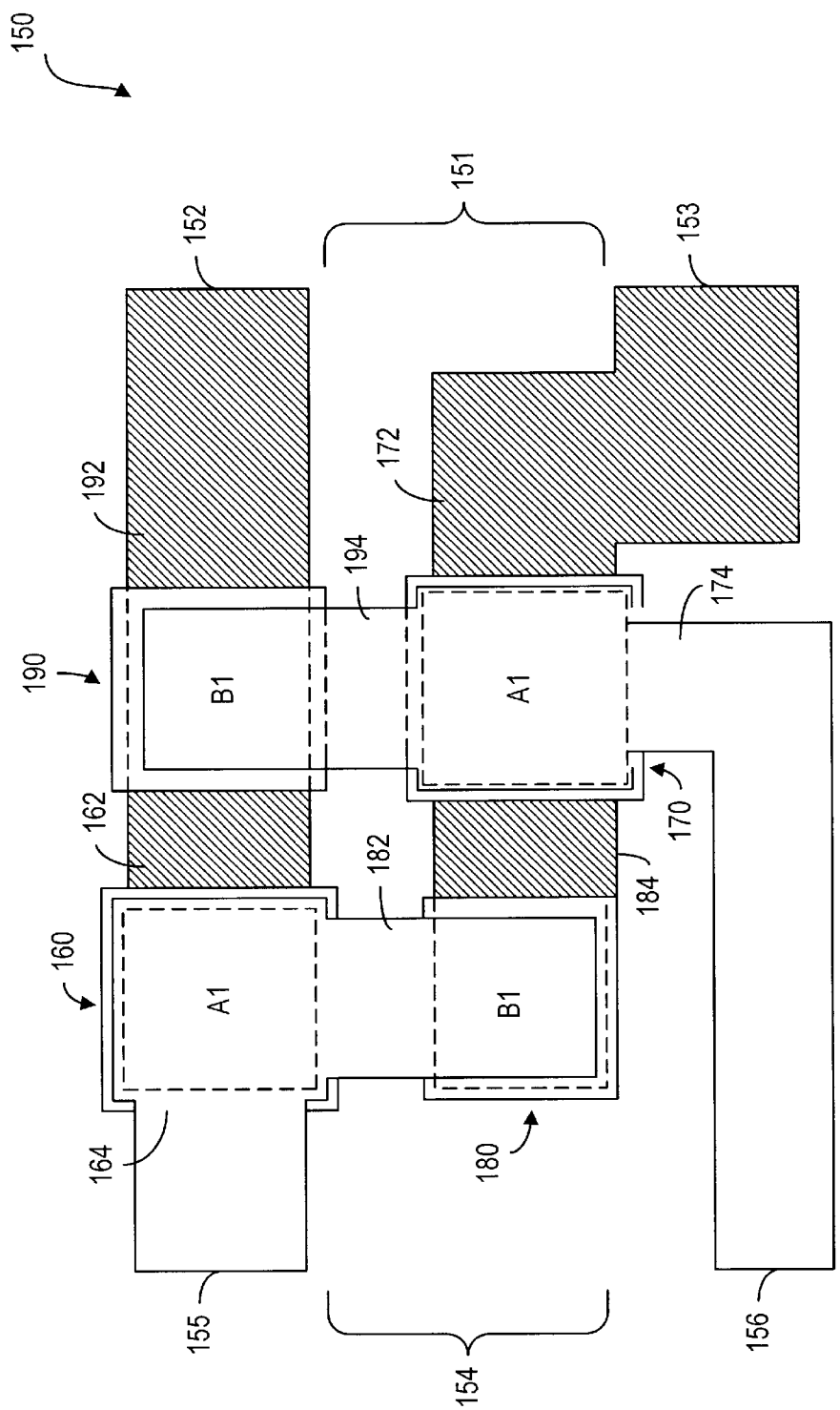
FIG. 15 is a diagrammatic representation showing a lattice filter segment, wherein the active area of the series elements and the active area of the shunt elements are different.
Figure 16A:
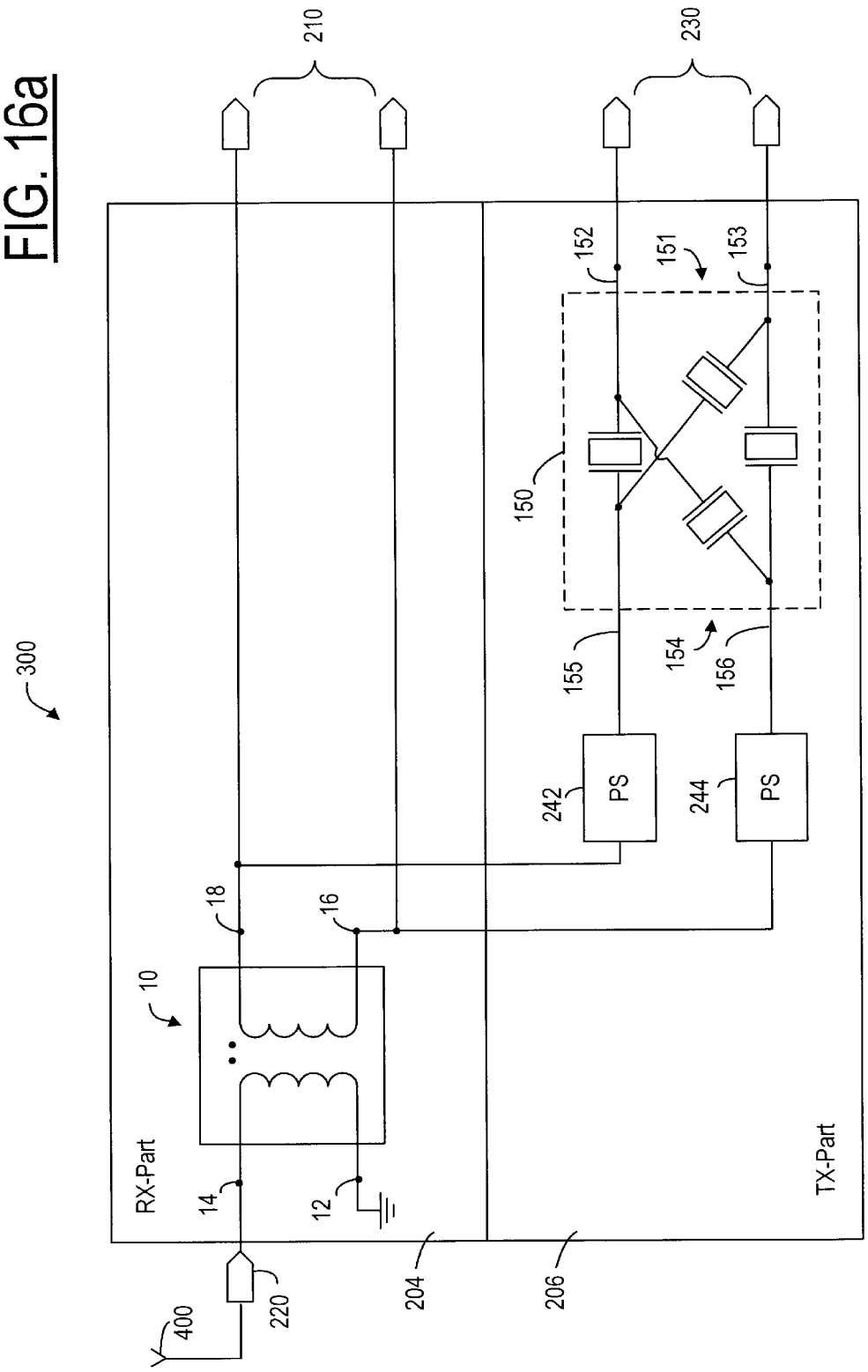
FIG. 16a is a block diagram showing a duplexer, wherein a balun is used in one transceiver part and a lattice filter is used in another transceiver part.
Figure 16B:
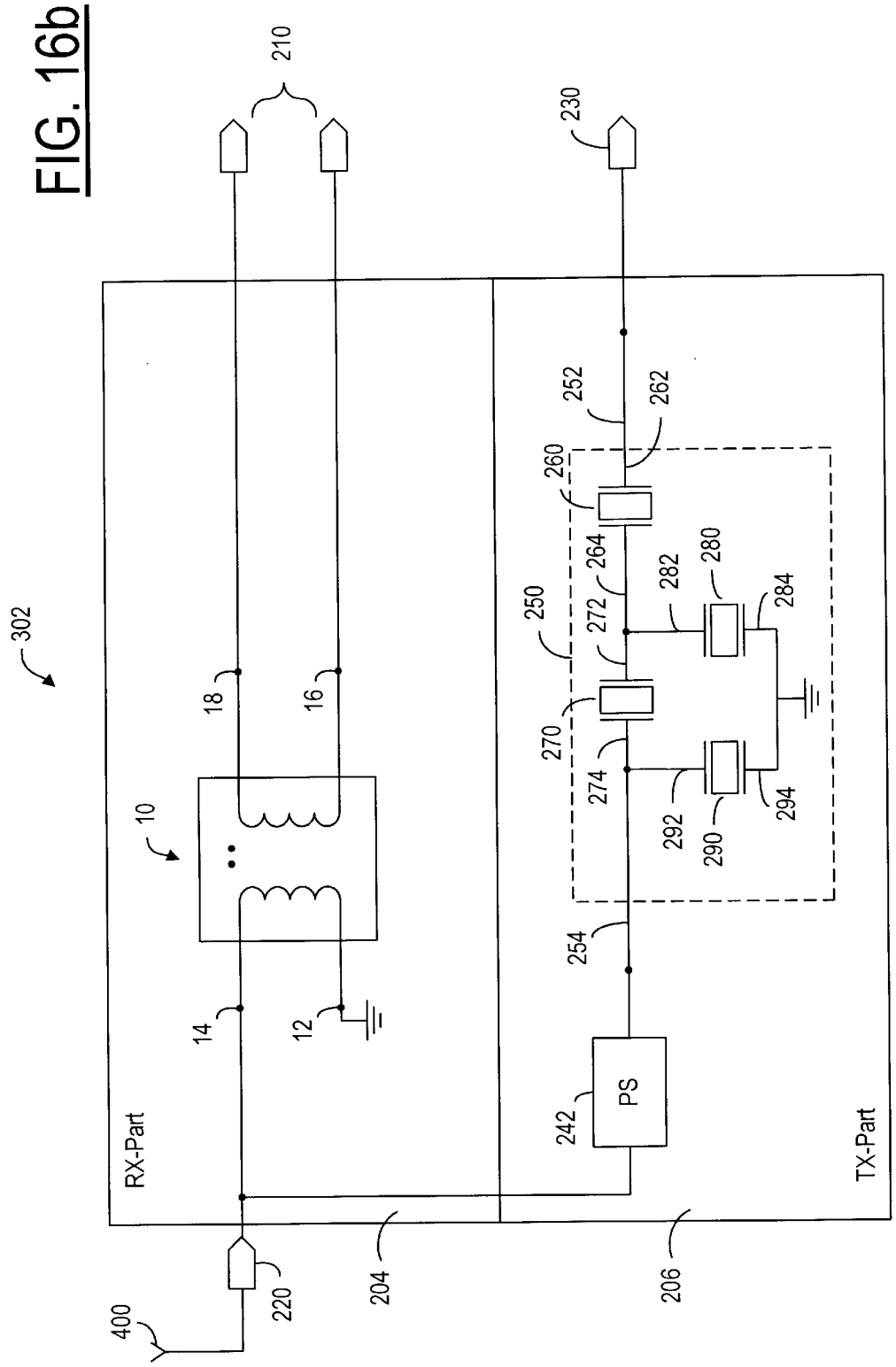
FIG. 16b is a block diagram showing a duplexer, wherein a balun is used in one transceiver part and a ladder filter is used in another transceiver part.
Figure 17A:
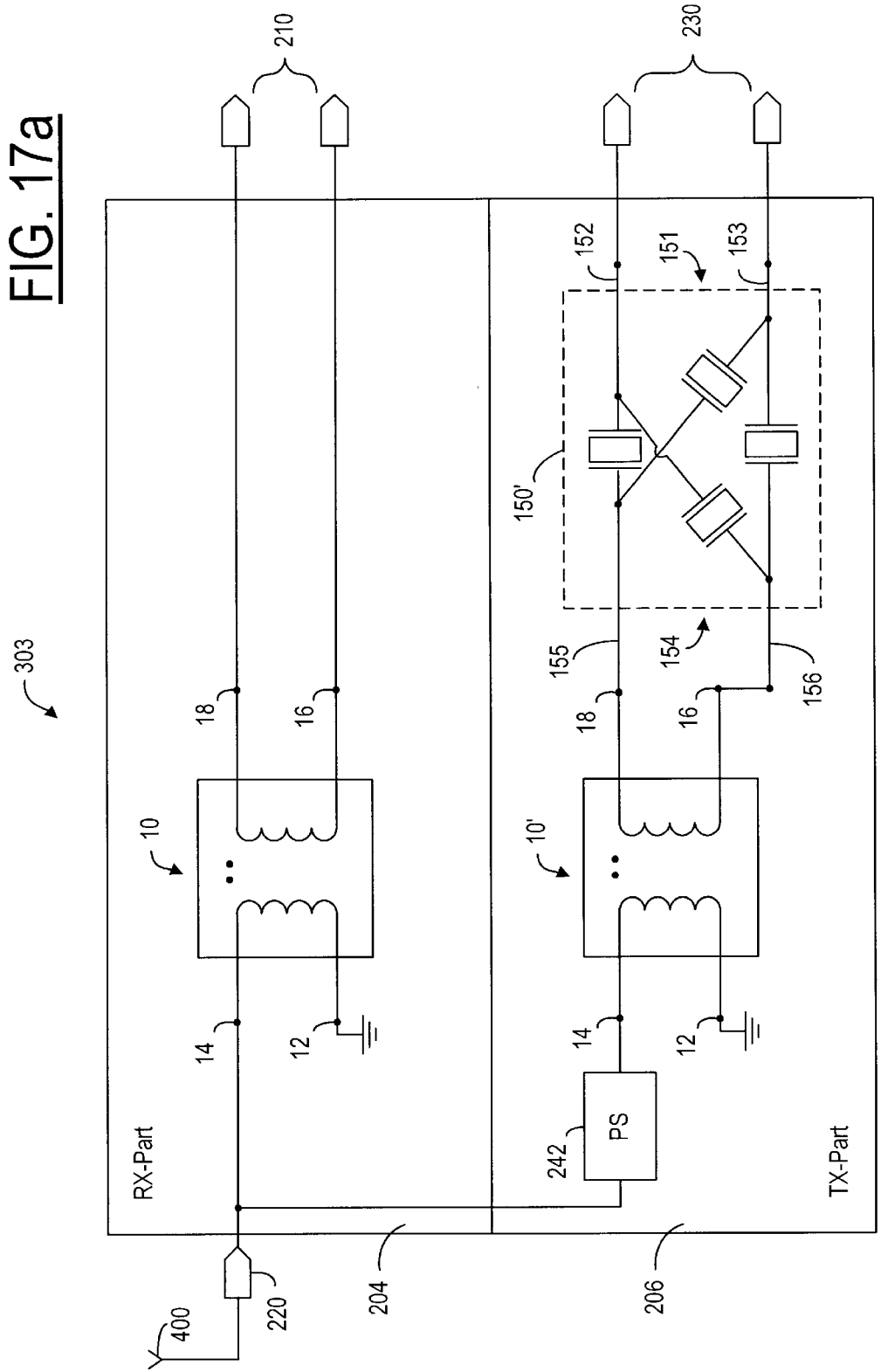
FIG. 17a is a block diagram showing a duplexer, wherein a balun is used in one transceiver part and a lattice filter, together with another balun, is used in another transceiver part.
Figure 17B:
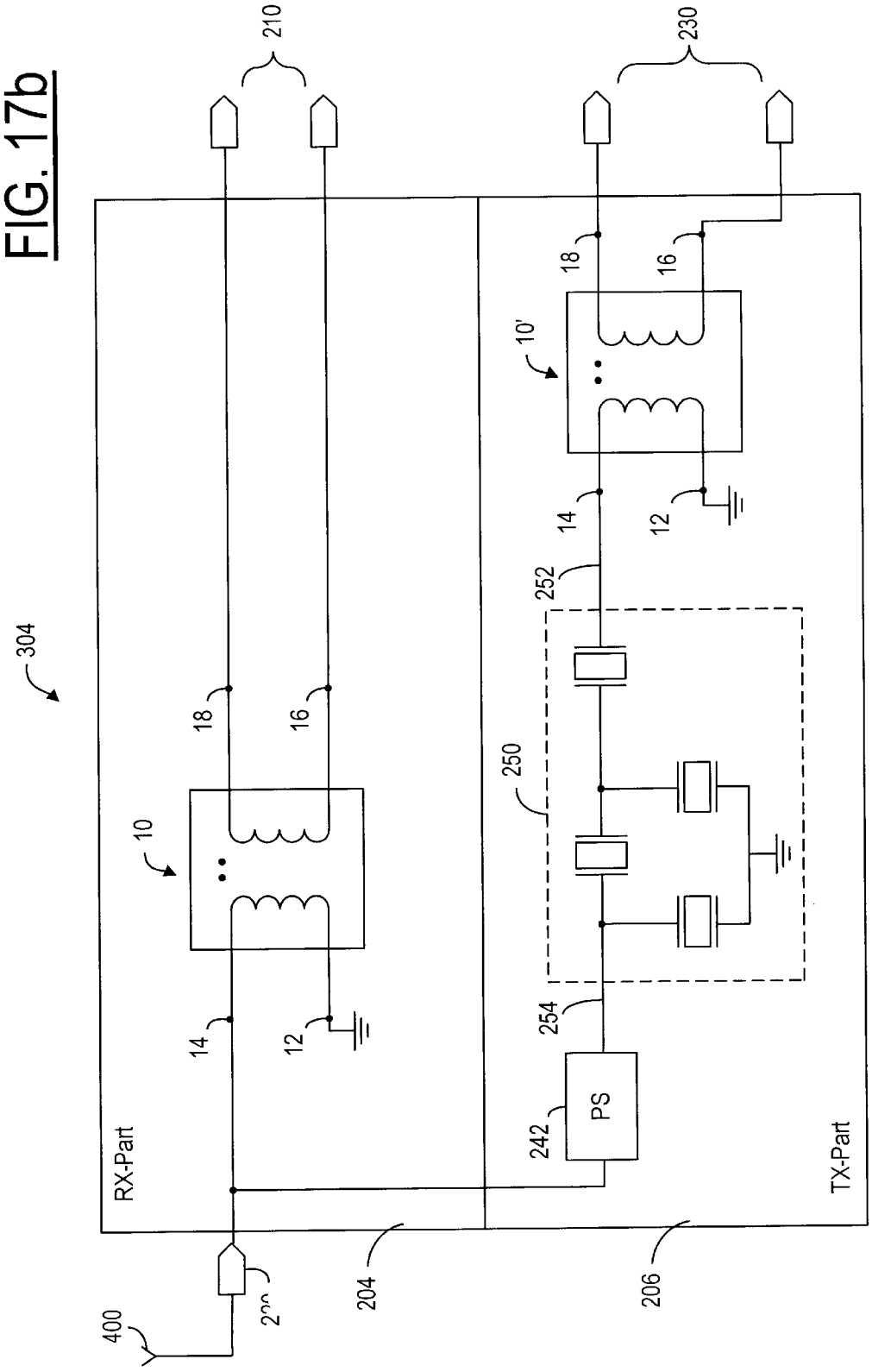
FIG. 17b is a block diagram showing a duplexer, wherein a balun is used in one transceiver part and a ladder filter, together with another balun, is used in another transceiver part.

Furthermore, the lattice filters 150, 150' in FIGS. 9–13 may have unequal series and shunt resonator areas to improve close-in selectivity, as disclosed in EP 1017170 "A Balanced Filter Structure". As shown in FIG. 15, the resonator area A1 of the series elements 160, 170 is slightly greater than the resonator area B1 of the shunt elements 180, 190.

Moreover, in the duplexers 200, 201, 202, 203, as shown in FIGS. 10–13, the lattice filter 150 can be omitted such that the signal output ends 18, 16 of the balun 10 are directly connected to the balanced port 210. In the duplexer 201 as shown in FIG. 11, both lattice filters 150, 150' can be omitted. In the duplexer 203 as shown in FIG. 13, both the lattice filter 150 and the ladder filter 250 can be omitted. As such, the duplexer will have one balun 10 in one transceiver part 204 and one filter 150, or 250 in another transceiver part 206, as shown in FIGS. 16a through 17b. Alternatively, each of the transceiver parts will have a balun 10, 10' as its filter, as shown in FIG. 18.

The phase shifters 242, 244 in the duplexers 200, 201, 202 and 203 provide a 90° phase-shift to signals conveyed between the RX-part 204 and the TX-part 206. However, the phase shift angle can be smaller or greater than 90°.

Thus, although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A bulk acoustic wave device having a signal input port, a first signal output port, a second signal output port and a device ground, said device having a resonant frequency and an acoustic wavelength characteristic of the resonant frequency, said device comprising:
   a first resonator having a first electrode, a second electrode and a first piezoelectric layer disposed between the first and second electrodes;
   a second resonator having a third electrode, a fourth electrode and a second piezoelectric layer disposed between the third and fourth electrodes; and a dielectric layer, wherein the first resonator and the second resonator are arranged in a stack with the dielectric layer disposed between the second electrode and the third electrode, and wherein
   the first electrode is coupled to the signal input port,
   the second electrode is electrically connected to the device ground,
   the third electrode is coupled to the first signal output port, and
   the fourth electrode is coupled to the second signal output port.

2. An acoustic wave apparatus formed on a substrate having an upper surface, said apparatus having a device ground, a signal input, a first signal output, a second signal output and a device ground, said structure comprising:
   a first bulk acoustic wave device; and a second bulk acoustic wave device coupled to the first bulk acoustic wave device, wherein the first bulk acoustic wave device comprising:
      a first resonator having a first electrode, a second electrode and a first piezoelectric layer disposed between the first and second electrodes; and
      a second resonator having a third electrode, a fourth electrode and a second piezoelectric layer disposed between the third and fourth electrodes, wherein the first resonator and the second resonator are arranged in a stack with a first dielectric layer disposed between the second and third electrode for electrically insulating the second electrode from the third electrode, and the second bulk acoustic wave device comprising:
      a first resonator having a first electrode, a second electrode and a first piezoelectric layer disposed between the first and second electrodes; and
      a second resonator having a third electrode, a fourth electrode and a second piezoelectric layer disposed between the third and fourth electrodes, wherein the first resonator and the second resonator are arranged in a stack with a first dielectric layer disposed between the second and third electrode for electrically insulating the second electrode from the third electrode, and wherein
         the fourth electrode of the first bulk acoustic wave device is coupled to the first signal output of the structure,
         the fourth electrode of the second bulk acoustic wave device is coupled to the second signal output of the structure,
         the first electrode of the first bulk acoustic wave device is coupled to the signal input of the structure and is electrically connected to the second electrode of the second bulk acoustic wave device, and
         the second electrode and the third electrode of the first bulk acoustic wave device are electrically connected to the device ground and the first electrode of the second bulk acoustic wave device.

3. A duplexer comprising:
   an antenna port;
   a first transceiver port;
   a second transceiver port;
   a device ground;
   a first balun coupled between the antenna port and the first transceiver port;

a second balun coupled between the antenna port and the second transceiver port; and a phase shifting means coupled between the first balun and the second balun at the antenna port, wherein each of the baluns has at least two resonators in a stacked-up configuration including a first resonator coupled between a signal input end and the device ground, and a second resonator coupled between a first signal output end and a second signal output end, wherein the signal input end is connected to the antenna port, and the first and second signal output ends of each balun are connected to each of the first and second transceiver ports.

4. A bulk acoustic device having a resonant frequency and an acoustic wavelength characteristic of the resonant frequency, said device comprising:

a first resonator having a first electrode, a second electrode and a first piezoelectric layer disposed between the first and second electrodes;

a second resonator having a third electrode, a fourth electrode and a second piezoelectric layer disposed between the third and fourth electrodes; and an electrically insulating layer, wherein the first resonator and the second resonator are arranged in a stack with the electrically insulating layer disposed between the second electrode and the third electrode, wherein the device has a signal input port, a first signal output port, a second signal output port and a device ground, and wherein the first electrode is coupled to the signal input port, the second electrode is electrically connected to the device ground, the third electrode is coupled to the first signal output port, and the fourth electrode is coupled to the second signal output port.

5. The bulk acoustic wave device of claim 4, further comprising a capacitive element coupled between the fourth electrode and the device ground for adjusting the parasitic capacitance therebetween.

6. The bulk acoustic wave device of claim 4, further comprising an inductance element coupled between the first and second signal output ports for impedance matching and bandwidth widening.

7. The bulk acoustic wave device of claim 4, further comprising an inductance element coupled between the signal input port and the device ground for impedance matching and bandwidth widening.

8. A duplexer comprising:

an antenna port;

a first transceiver port;

a second transceiver port;

a device ground;

a balun coupled between the antenna port and the first transceiver port;

a bulk acoustic wave filter having a first filter end coupled to the second transceiver port, and a second filter end coupled to the antenna port; and a phase shifting means coupled between the balun and bulk acoustic wave filter at the antenna port for matching the balun and the bulk acoustic wave filter, wherein the balun having at least two resonators in a stacked-up configuration including a first resonator coupled between a signal input end and the device ground, and a second resonator coupled between a first signal output end and a second signal output end, wherein the signal input end is connected to the antenna port, and the first and second signal output ends are connected to the first transceiver port.

9. The duplexer of claim 8, wherein the bulk acoustic wave filter comprises at least one lattice filter including two series elements and two shunt elements connected to the series elements in a cross-connection fashion.

10. The duplexer of claim 9, further comprising a further balun coupled between the bulk acoustic wave filter and the antenna port, wherein the further balun has at least two resonators in a stacked-up configuration including a first resonator coupled between a signal input end and the device ground, and a second resonator coupled between a first signal output end and a second signal output end, wherein the signal input end is connected to the antenna port via the phase shifting means, and the first and second signal output ends are connected to the second filter end of the bulk acoustic wave filter.

11. The duplexer of claim 8, wherein the bulk acoustic wave filter comprises at least one ladder filter including a series element having a first end connected to the first filter end, and a second end coupled to the antenna port via the phase shifter, and a shunt element having a first end connected to the second end of the series element, and a second end connected to the device ground.

12. The duplexer of claim 11, further comprising a further balun coupled between the bulk acoustic wave filter and the second transceiver port, wherein the further balun has at least two resonators in a stacked-up configuration including a first resonator coupled between a signal input end and the device ground, and a second resonator coupled between a first signal output end and a second signal output end, wherein the signal input end is connected to the first filter end of the bulk acoustic wave filter, and the first and second signal output ends are connected to the second transceiver port.

13. A bulk acoustic wave filter having a signal input terminal, a first signal output terminal, a second signal output terminal and a device ground, said bulk acoustic wave filter comprising:

a balun having at least two resonators in a stacked-up configuration including a first resonator coupled between a signal input end and the device ground, and a second resonator coupled between a first signal output end and a second signal output end, wherein the first signal output end is coupled to the first signal output terminal, the second signal output end is coupled to the second signal output terminal; and at least one acoustic filter segment having a series element having a first end and a second end, and a shunt element having a first end and a second end, wherein the first end of the series element is connected to the signal input end of the balun, the second end of the series element is connected to the signal input terminal, the first end of the shunt element is connected to the second end of the series element, and the second end of the shunt element is connected to the device ground.

14. The bulk acoustic wave filter of claim 13, wherein the first resonator of the balun comprises a first electrode connected to the signal input end, a second electrode connected to the device ground, and a first piezoelectric layer disposed between the first and second electrodes, and the second resonator of the balun comprises a third electrode connected to the first signal output end, a fourth electrode connected to the second signal output end, and a second piezoelectric layer disposed between the third and fourth electrodes, and wherein the balun further comprises a dielectric layer disposed between the second electrode of the first resonator and the third electrode of the second resonator.

15. A bulk acoustic wave device structure formed on a substrate having an upper section, said structure comprising:

a first electrode provided on the upper section;

a first piezoelectric layer provided on top of at least part of the first electrode;

a second electrode provided on top of at least part of the first piezoelectric layer, wherein the first electrode, the first piezoelectric layer and the second electrode have an overlapping area for forming a first acoustic resonator;

a dielectric layer disposed on top of at least part of the second electrode;

a third electrode disposed on top of at least part of the dielectric layer such that the third electrode and the second electrode are electrically insulated by the dielectric layer;

a second piezoelectric layer provided on top of at least part of the third electrode, and a fourth electrode provided on top of at least part of the second piezoelectric layer, wherein the third electrode, the second piezoelectric layer and the fourth electrode have a further overlapping area for forming a second resonator, wherein the structure has a signal input port, a first signal output port, a second signal output port and a device ground, and wherein the first electrode is coupled to the signal input port, the second electrode is electrically connected to the device ground, the third electrode is coupled to the first signal output port, and the fourth electrode is coupled to the second signal output port.

16. The bulk acoustic wave device of claim 15, further comprising a capacitive element coupled between the fourth electrode and the device ground for adjusting the parasitic capacitance therebetween.

17. The bulk acoustic wave device of claim 16, wherein the first acoustic resonator and the second acoustic resonator have a further overlapping area for defining an active area of the bulk acoustic wave device structure, and wherein the second electrode has an extended portion located outside the active area, the fourth electrode has a further extended portion located outside the active area, wherein the extended portion and the further extended portion have yet another overlapping area for forming said capacitive element.

18. The bulk acoustic wave device of claim 15, further comprising an inductance element coupled between the first and second signal output ports for impedance matching and bandwidth widening.

19. The bulk acoustic wave device of claim 15, further comprising an inductance element coupled between the signal input port and the device ground for impedance matching and bandwidth widening.

20. The bulk acoustic wave device structure of claim 15, further having an acoustic mirror structure provided between part of the first electrode and the upper section of the substrate.

21. A bulk acoustic wave filter having a signal input terminal, a first signal output terminal, a second signal output terminal and a device ground, said bulk acoustic wave filter comprising:

at least one acoustic filter segment having a first terminal coupled to the first signal output terminal, a second terminal coupled to the second signal output terminal, a third terminal, a fourth terminal, a first series element having a first end connected to the first terminal and a second end connected to the third terminal, a second series element having a first end connected to the second terminal and a second end connected to the fourth terminal, a first shunt element having a first end connected to the third terminal and a second end connected to the second terminal, and a second shunt element having a first end connected to the first terminal and a second end connected to the fourth terminal; and a balun having at least two resonators in a stacked-up configuration including a first resonator coupled between a signal input end and the device ground, and a second resonator coupled between a first signal output end and a second signal output end, wherein the signal input end is coupled to the signal input terminal, the first signal output end is connected to the fourth terminal of the acoustic filter segment, and the second signal output end is connected to the third terminal of the acoustic filter segment.

22. The bulk acoustic wave filter of claim 21, wherein the first resonator of the balun comprises a first electrode connected to the signal input end, a second electrode connected to the device ground, and a first piezoelectric layer disposed between the first and second electrodes, and the second resonator of the balun comprises a third electrode connected to the first signal output end, a fourth electrode connected to the second signal output end, and a second piezoelectric layer disposed between the third and fourth electrodes, and wherein the balun further comprises a dielectric layer disposed between the second electrode of the first resonator and the third electrode of the second resonator.

23. The bulk acoustic wave filter of claim 21, wherein each of the first and second series elements has a first active area and each of the first and second shunt elements has a second active area different from the first active area in size.

24. The bulk acoustic wave filter of claim 23, wherein the first active area is greater than the second active area.

25. The bulk acoustic wave filter of claim 23, wherein the ratio of the first active area to the second active area is substantially equal to 1.2.

26. A duplexer comprising:
   a first port;
   a second port;
   a third port;
   a device ground;
   a lattice bulk acoustic wave filter, disposed between the first port and the second port, said lattice bulk acoustic wave filter having
      a first end coupled to the first port, and
      a second end;
   a balun coupled between the second port and the second end of the lattice filter;
   a further bulk acoustic wave filter having
      a first end coupled to the third port, and
      a second end coupled to the second port; and
   a phase shifting means coupled between the lattice bulk acoustic wave filter and the further bulk acoustic wave filter for matching the lattice bulk acoustic wave filter and the further bulk acoustic wave filter, wherein the balun having at least two resonators in a stacked-up configuration including
      a first resonator coupled between a signal input end and the device ground, and
      a second resonator coupled between a first signal output end and a second signal output end, wherein
   the signal input end is connected to the second port, and
   the first and second signal output ends are connected to the second end of the lattice bulk acoustic wave filter.

27. The duplexer of claim 26, wherein
   the lattice bulk acoustic wave filter comprises a plurality of series elements and shunt elements, each element including a piezoelectric layer having a first thickness,
   the further bulk acoustic wave filter comprises at least one series element and one shunt element, each element including a piezoelectric layer having a second thickness different from the first thickness,
   the first resonator of the balun includes a piezoelectric layer having a third thickness substantially equal to the first thickness, and
   the second resonator of the balun includes a piezolectic layer having a fourth thickness substantially equal to the second thickness.

28. The duplexer of claim 27, wherein the first thickness is greater than the second thickness.

29. The duplexer of claim 27, wherein the first thickness is smaller than the second thickness.

30. The duplexer of claim 26, further comprising a further balun coupled between the phase shifting means and the further bulk acoustic wave filter, wherein said further balun having at least two resonators in a stacked-up configuration including
   a first resonator coupled between a signal input end and the device ground, and
   a second resonator coupled between a first signal output end and a second signal output end, wherein the signal input end is connected to the phase shifting means and the signal output ends are connected to the second end of the further bulk acoustic wave filter.

31. The duplexer of claim 30, wherein
   the lattice bulk acoustic wave filter comprises a plurality of series elements and shunt elements, each element including a piezoelectric layer having a first thickness,
   the further bulk acoustic wave filter comprises at least one series element and one shunt element, each element including a piezoelectric layer having a second thickness different from the first thickness,
   the first resonator of the balun includes a piezoelectric layer having a third thickness substantially equal to the first thickness,
   the second resonator of the balun includes a piezoelectric layer having a fourth thickness substantially equal to the second thickness,
   the first resonator of the further balun includes a piezoelectric layer having a fifth thickness substantially equal to the third thickness, and
   the second resonator of the further balun includes a piezoelectric layer having a sixth thickness substantially equal to the fourth thickness.

32. The duplexer of claim 31, wherein the first thickness is greater than the second thickness.

33. The duplexer of claim 31, wherein the first thickness is smaller than the second thickness.

34. The duplexer of claim 30, wherein
   the lattice bulk acoustic wave filter comprises a plurality of series elements and shunt elements, each element including a piezoelectric layer having a first thickness,
   the further bulk acoustic wave filter comprises at least one series element and one shunt element, each element including a piezoelectric layer having a second thickness different from the first thickness,
   the first resonator of the balun includes a piezoelectric layer having a third thickness substantially equal to the second thickness,
   the second resonator of the balun includes a piezoelectric layer having a fourth thickness substantially equal to the first thickness,
   the first resonator of the further balun includes a piezoelectric layer having a fifth thickness substantially equal to the third thickness, and
   the second resonator of the further balun includes a piezoelectric layer having a sixth thickness substantially equal to the fourth thickness.

35. The duplexer of claim 34, wherein the first thickness is greater than the second thickness.

36. The duplexer of claim 34, wherein the first thickness is smaller than the second thickness.

37. The duplexer of claim 26, wherein
   the lattice bulk acoustic wave filter comprises a plurality of series elements and shunt elements, each element including a piezoelectric layer having a first thickness,
   the further bulk acoustic wave filter comprises at least one series element and one shunt element, each element including a piezoelectric layer having a second thickness different from the first thickness,
   the first resonator of the balun includes a piezoelectric layer having a third thickness substantially equal to the second thickness, and
   the second resonator of the balun includes a piezolectic layer having a fourth thickness substantially equal to the first thickness.

38. The duplexer of claim 37, wherein the first thickness is smaller than the second thickness.

39. The duplexer of claim 37, wherein the first thickness is greater than the second thickness.

40. The duplexer of claim 26, wherein the further bulk acoustic wave filter comprises a further lattice bulk acoustic wave filter.

41. The duplexer of claim 26, wherein the further bulk acoustic wave filter comprises a ladder bulk acoustic wave filter.

42. The duplexer of claim 41, further comprising a further balun disposed between the ladder bulk acoustic wave filter and the third port, wherein said further balun having at least two resonators in a stacked-up configuration including a first resonator coupled between a signal input end and the device ground, and a second resonator coupled between a first signal end and a second signal end, wherein the signal input end is connected to the first end of the ladder bulk acoustic device, and the signal output ends are connected to the third port.

43. The duplexer of claim 42, wherein the lattice bulk acoustic wave filter comprises a plurality of series elements and shunt elements, each element including a piezoelectric layer having a first thickness, the further bulk acoustic wave filter comprises at least one series element and one shunt element, each element including a piezoelectric layer having a second thickness different from the first thickness, the first resonator of the balun includes a piezoelectric layer having a third thickness substantially equal to the second thickness, the second resonator of the balun includes a piezoelectric layer having a fourth thickness substantially equal to the first thickness, the first resonator of the further balun includes a piezoelectric layer having a fifth thickness substantially equal to the third thickness, and the second resonator of the further balun includes a piezoelectric layer having a sixth thickness substantially equal to the fourth thickness.

44. The duplexer of claim 43, wherein the first thickness is greater than the second thickness.

45. The duplexer of claim 43, wherein the first thickness is smaller than the second thickness.

46. The duplexer of claim 42, wherein the lattice bulk acoustic wave filter comprises a plurality of series elements and shunt elements, each element including a piezoelectric layer having a first thickness, the further bulk acoustic wave filter comprises at least one series element and one shunt element, each element including a piezoelectric layer having a second thickness different from the first thickness, the first resonator of the balun includes a piezoelectric layer having a third thickness substantially equal to the first thickness, the second resonator of the balun includes a piezoelectric layer having a fourth thickness substantially equal to the second thickness, the first resonator of the further balun includes a piezoelectric layer having a fifth thickness substantially equal to the third thickness, and the second resonator of the further balun includes a piezoelectric layer having a sixth thickness substantially equal to the fourth thickness.

47. The duplexer of claim 46, the first thickness is greater than the second thickness.

48. The duplexer of claim 46, wherein the first thickness is smaller than the second thickness.

* * * * *

UNITED STATES PATENT AND TRADEMARK OFFICE
CERTIFICATE OF CORRECTION

PATENT NO. : 6,670,866 B2
DATED : December 30, 2003
INVENTOR(S) : Ellä et al.

It is certified that error appears in the above-identified patent and that said Letters Patent is hereby corrected as shown below:

<u>Title page,</u>
Item [73], Assignee, add -- Infineon Technologies AG, Munchen, (DE) --.

Signed and Sealed this

Twenty-seventh Day of December, 2005

JON W. DUDAS
*Director of the United States Patent and Trademark Office*